United States Patent
Kyung et al.

(10) Patent No.: US 11,791,314 B2
(45) Date of Patent: Oct. 17, 2023

(54) SEMICONDUCTOR PACKAGES

(71) Applicant: Samsung Electronics Co., Ltd., Suwon-si (KR)

(72) Inventors: Seoeun Kyung, Seoul (KR); Inhee Yoo, Osan-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 123 days.

(21) Appl. No.: 17/467,860

(22) Filed: Sep. 7, 2021

(65) Prior Publication Data

US 2022/0149010 A1    May 12, 2022

(30) Foreign Application Priority Data

Nov. 10, 2020   (KR) .................. 10-2020-0149330

(51) Int. Cl.
*H01L 25/065* (2023.01)
*H01L 23/00* (2006.01)
(Continued)

(52) U.S. Cl.
CPC .......... *H01L 25/0657* (2013.01); *H01L 24/32* (2013.01); *H01L 24/73* (2013.01); *H01L 25/18* (2013.01); *H01L 25/50* (2013.01); *H01L 24/33* (2013.01); *H01L 24/48* (2013.01); *H01L 24/49* (2013.01); *H01L 24/83* (2013.01); *H01L 24/92* (2013.01); *H01L 2224/32059* (2013.01); *H01L 2224/32145* (2013.01); *H01L 2224/32221* (2013.01); *H01L 2224/33181* (2013.01); *H01L 2224/48091* (2013.01); *H01L 2224/49176* (2013.01); *H01L 2224/73215* (2013.01); *H01L 2224/73265* (2013.01);
(Continued)

(58) Field of Classification Search
CPC .................................................. H01L 25/0652
See application file for complete search history.

(56) References Cited

U.S. PATENT DOCUMENTS 6,857,470 B2   2/2005   Park et al.
7,687,920 B2   3/2010   Yang et al.
(Continued)

FOREIGN PATENT DOCUMENTS

JP         5029308 B2      7/2012
KR      19920010798 A      6/1992
(Continued)

*Primary Examiner* — Yu-Hsi D Sun
(74) *Attorney, Agent, or Firm* — Myers Bigel, P.A.

(57) ABSTRACT

Disclosed is a semiconductor package comprising a first semiconductor chip on a substrate, a second semiconductor chip between the substrate and the first semiconductor chip, and a spacer between the substrate and the first semiconductor chip. The substrate includes a first substrate pad between the second semiconductor chip and the spacer. The second semiconductor chip includes a chip pad and a signal wire. The spacer includes a first dummy pad on the spacer and a first dummy wire coupled to the first dummy pad. The first dummy pad is adjacent to the second semiconductor chip. The first semiconductor chip is attached to the second semiconductor chip and the spacer by an adhesive layer on the first semiconductor chip. A portion of each of the signal wire and the first dummy wire are in the adhesive layer.

20 Claims, 23 Drawing Sheets

(51) Int. Cl.
*H01L 25/00* (2006.01)
*H01L 25/18* (2023.01)

(52) U.S. Cl.
CPC ............... *H01L 2224/83203* (2013.01); *H01L 2224/92165* (2013.01); *H01L 2224/92247* (2013.01); *H01L 2225/0651* (2013.01); *H01L 2225/06506* (2013.01); *H01L 2225/06562* (2013.01); *H01L 2924/182* (2013.01); *H01L 2924/1815* (2013.01)

(56) References Cited

U.S. PATENT DOCUMENTS

| | | | |
|---|---|---|---|
| 2008/0160678 A1 | 7/2008 | Wang et al. | |
| 2011/0089575 A1 | 4/2011 | Lee | |
| 2019/0259742 A1* | 8/2019 | Han | H01L 24/49 |
| 2020/0013767 A1* | 1/2020 | Baik | H01L 23/5386 |
| 2022/0059473 A1* | 2/2022 | Park | H01L 25/0652 |

FOREIGN PATENT DOCUMENTS

| | | |
|---|---|---|
| KR | 100508682 B1 | 8/2005 |
| KR | 20110041301 A | 4/2011 |

\* cited by examiner

SEMICONDUCTOR PACKAGES

CROSS-REFERENCE TO RELATED APPLICATION

This U.S. non-provisional application claims priority under 35 U.S.C § 119 to Korean Patent Application No. 10-2020-0149330, filed on Nov. 10, 2020, in the Korean Intellectual Property Office, the disclosure of which is hereby incorporated by reference in its entirety.

FIELD

The present disclosure relates to semiconductor packages.

BACKGROUND

A typical stack package has a structure in which a plurality of substrates are stacked. For example, the stacked package may include semiconductor chips that are sequentially stacked on a printed circuit board (PCB). Connection pads are formed on the semiconductor chips. Bonding wires may be used to connect the connection pads, such that the semiconductor chips may be electrically coupled to each other. The printed circuit board is provided thereon with a logic chip that controls the semiconductor chips.

Portable devices have been increasingly demanded in recent electronic product markets and, as a result, demand has increased for reduction in size and weight of electronic parts mounted on the portable devices. In order to accomplish the reduction in size and weight of the electronic parts, there may be a need for technology to integrate a number of individual devices into a single package as well as technology to reduce individual sizes of mounting parts. In particular, semiconductor packages operated at high frequency signals may need to have compactness and excellent electrical characteristics.

SUMMARY

Some embodiments of the present inventive concepts provide a semiconductor package with improved structural stability.

According to some embodiments of the present inventive concepts, a semiconductor package may comprise: a first semiconductor chip on a substrate; a second semiconductor chip between the substrate and the first semiconductor chip; and a spacer between the substrate and the first semiconductor chip and spaced apart from the second semiconductor chip. The substrate may include a first substrate pad between the second semiconductor chip and the spacer. The second semiconductor chip may include a chip pad on a top surface of the second semiconductor chip and a signal wire extending from the chip pad toward the first substrate pad. The spacer may include a first dummy pad on a top surface of the spacer and a first dummy wire coupled to the first dummy pad. The first dummy pad may be adjacent to the second semiconductor chip. The first semiconductor chip may be attached to the top surface of the second semiconductor chip and the top surface of the spacer by an adhesive layer on a bottom surface of the first semiconductor chip. A portion of the signal wire and a portion of the first dummy wire may be in the adhesive layer.

According to some embodiments of the present inventive concepts, a semiconductor package may comprise: a substrate including a plurality of first substrate pads aligned with each other in a first direction; a first semiconductor chip on the substrate; a spacer on the substrate and spaced apart in a second direction from the first semiconductor chip across the plurality of first substrate pads, the second direction intersecting the first direction; a second semiconductor chip attached by an adhesive layer to a top surface of the first semiconductor chip and a top surface of the spacer; a plurality of signal wires extending toward the plurality of first substrate pads, respectively, from the top surface of the first semiconductor chip; a plurality of first bonding parts on respective dummy pads on the top surface of the spacer; and a molding layer on the first semiconductor chip, the spacer, and the second semiconductor chip, the molding layer being in a space between the first semiconductor chip and the spacer. The dummy pads may be aligned with each other in the first direction adjacent a first lateral surface of the spacer. The first lateral surface may be adjacent to the first semiconductor chip.

According to some embodiments of the present inventive concepts, a semiconductor package may comprise: a first semiconductor chip and a spacer that are spaced apart from each other on a substrate; and a second semiconductor chip attached by an adhesive layer to the first semiconductor chip and the spacer. The first semiconductor chip may include a plurality of signal wires extending from a top surface of the first semiconductor chip and passing through a space between the first semiconductor chip and the spacer to connect to the substrate. The spacer may include a plurality of dummy wires connected to a top surface of the spacer. The plurality of signal wires may be aligned with each other adjacent a first lateral surface of the first semiconductor chip. The first lateral surface of the first semiconductor chip may face the spacer. The plurality of dummy wires may be aligned with each other adjacent a second lateral surface of the spacer. The second lateral surface of the spacer may face the first semiconductor chip. The adhesive layer may be in contact with the top surface of the first semiconductor chip and the top surface of the spacer. Between the first semiconductor chip and the spacer, the adhesive layer may be spaced apart from the first lateral surface of the first semiconductor chip and the second lateral surface of the spacer.

DETAILED DESCRIPTION

The following will now describe a semiconductor package according to the present inventive concepts with reference to the accompanying drawings.

Figure 1:
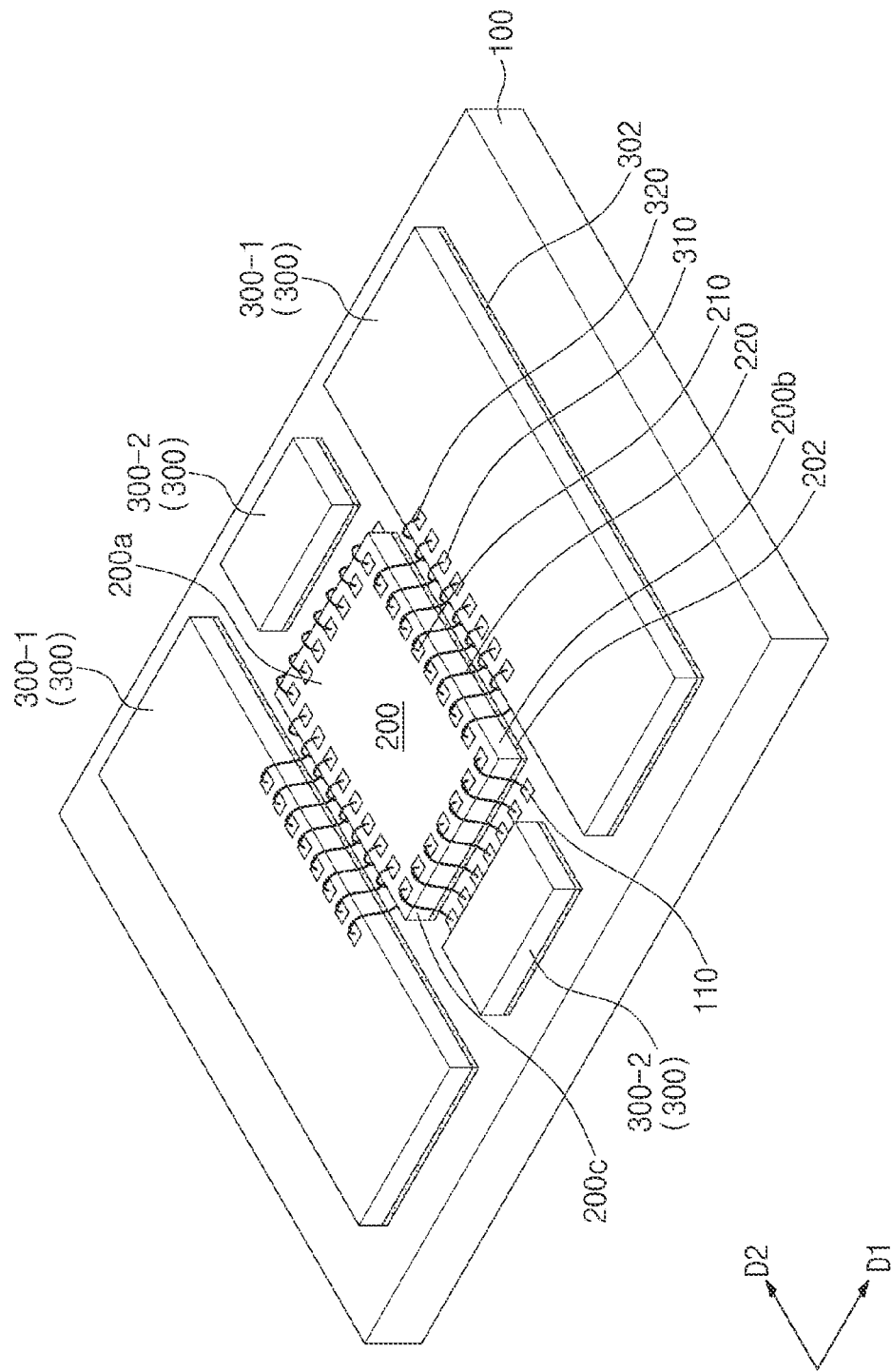
FIG. 1 is a perspective view illustrating a semiconductor package according to some embodiments of the present inventive concepts.
Figure 2:
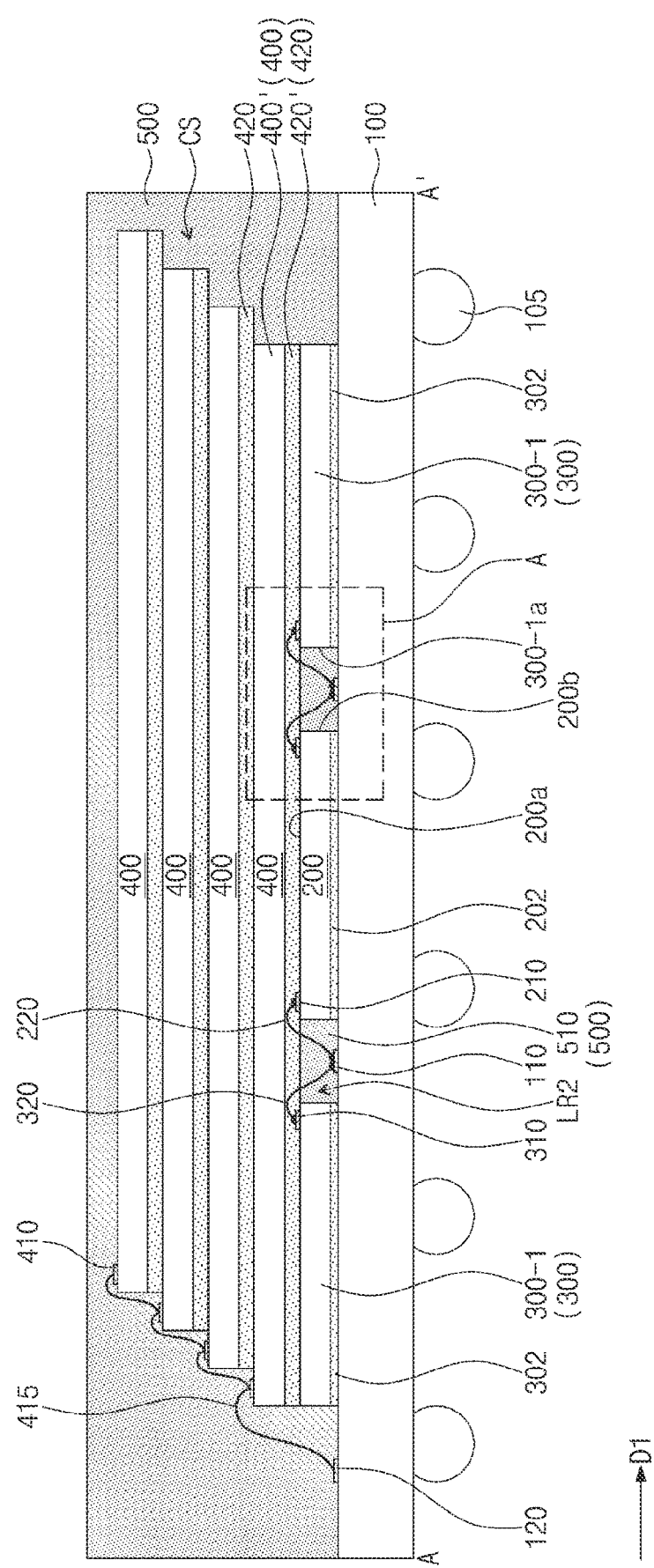
FIGS. 2 and 3 are cross-sectional views illustrating a semiconductor package according to some embodiments of the present inventive concepts.
Figure 3:
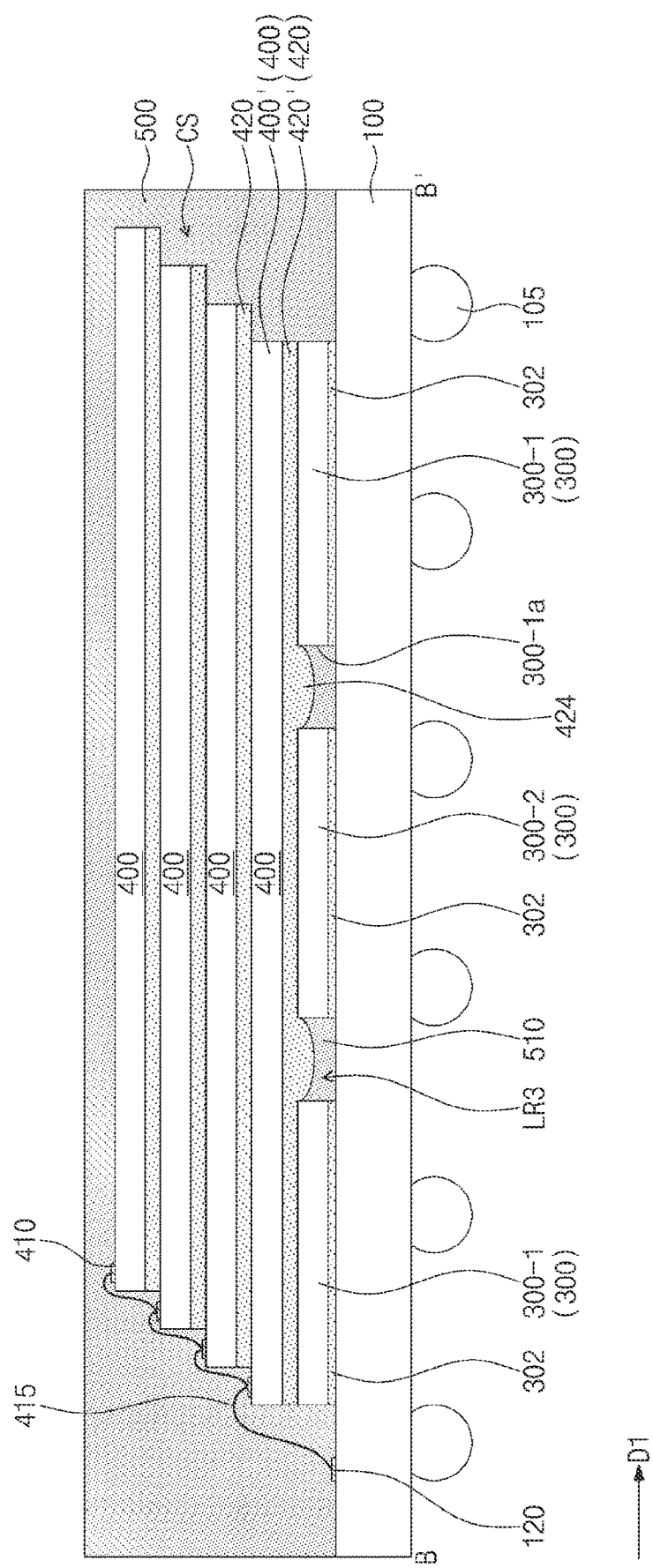
Figure 4:
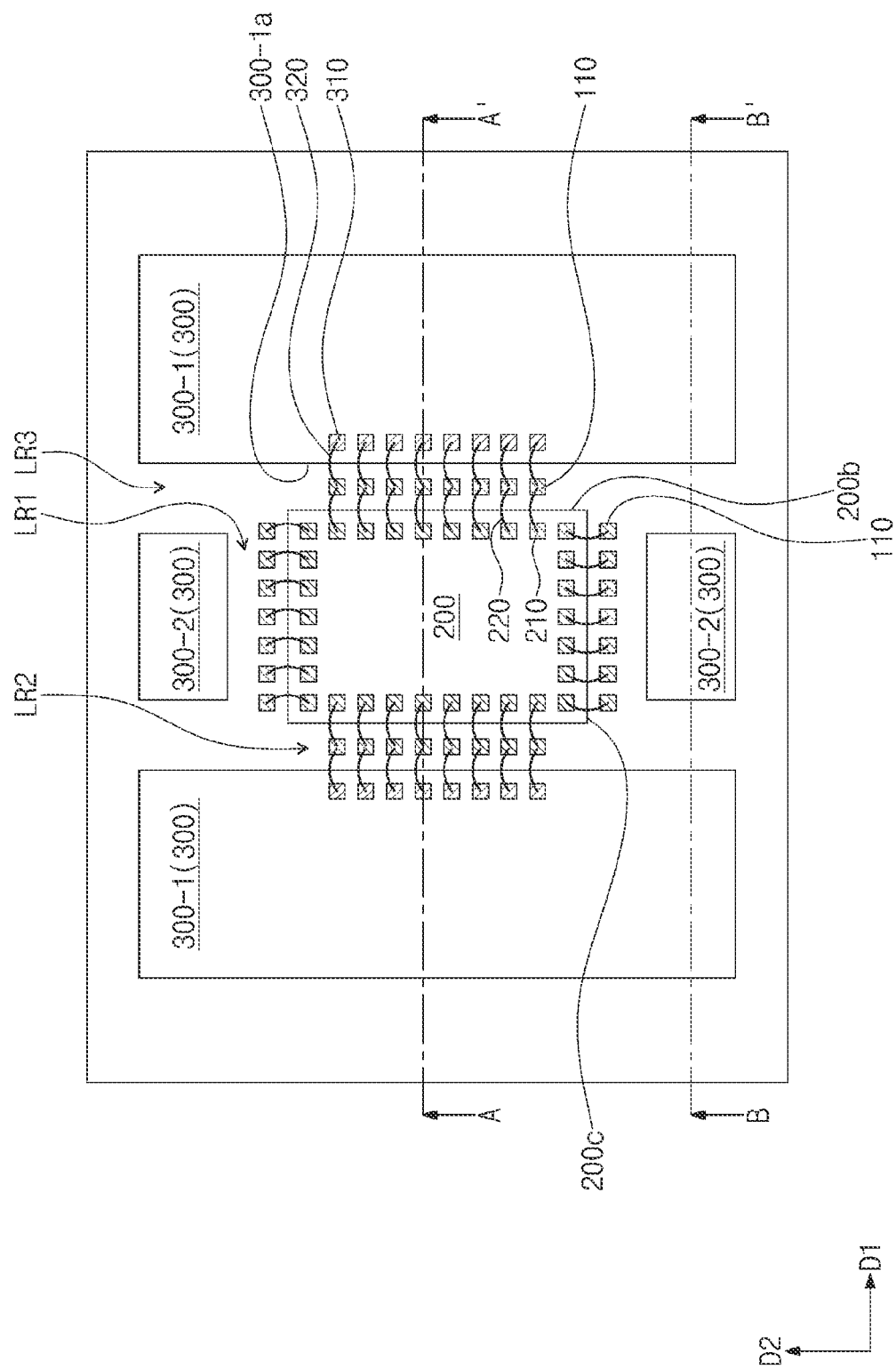
FIG. 4 is a plan view illustrating a semiconductor package according to some embodiments of the present inventive concepts.
Figure 5:
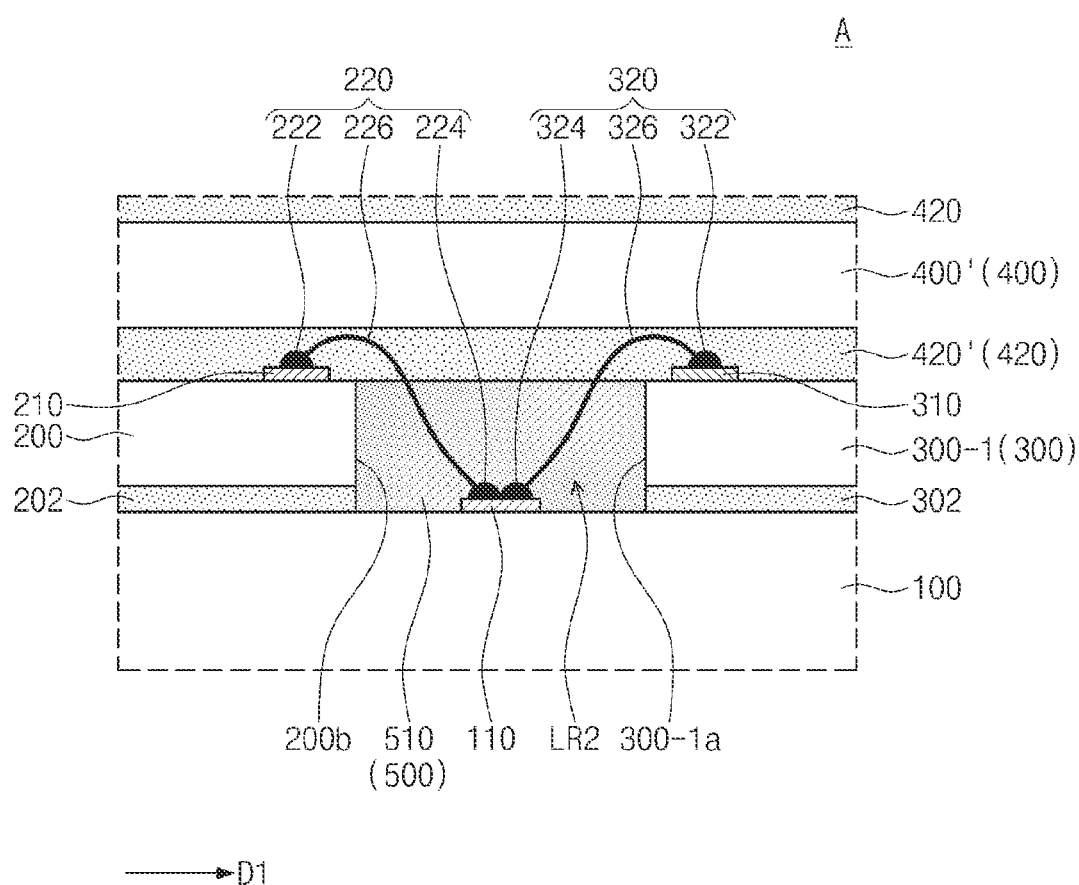
FIGS. 5 to 7 are enlarged cross-sectional views illustrating a semiconductor package according to some embodiments of the present inventive concepts.
Figure 6:
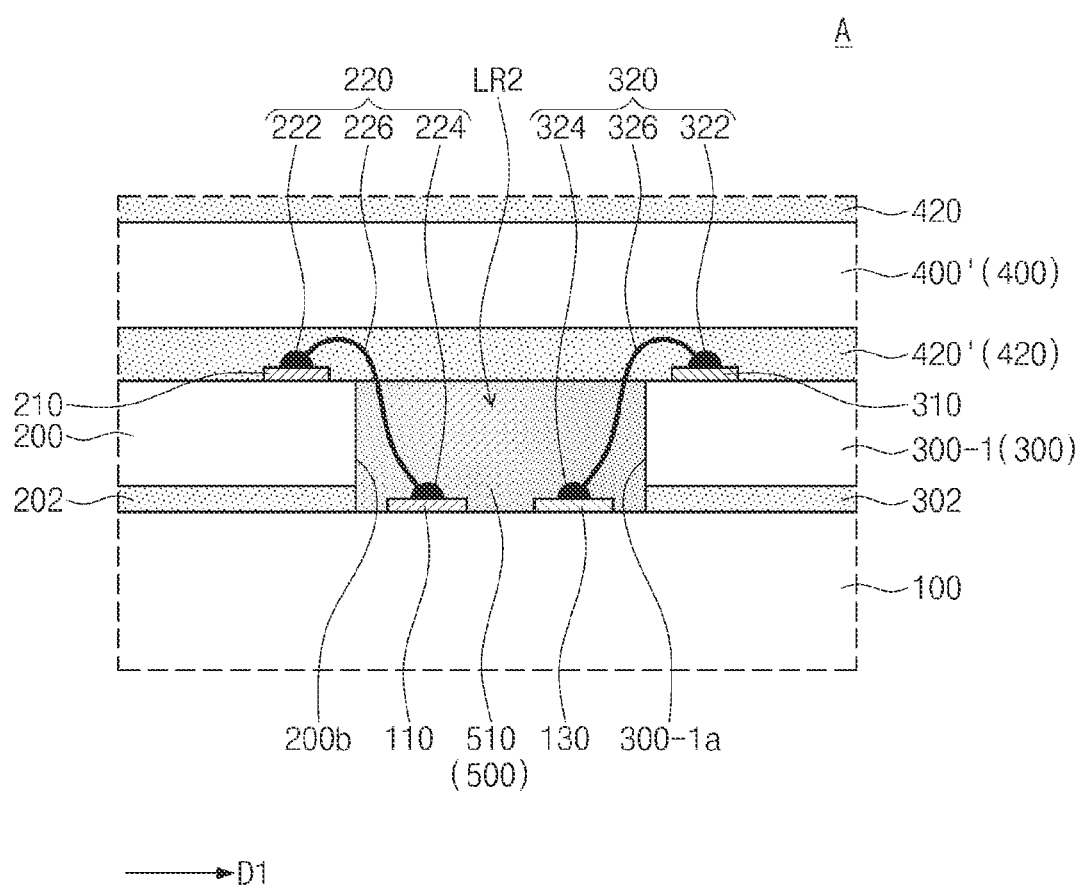
Figure 7:
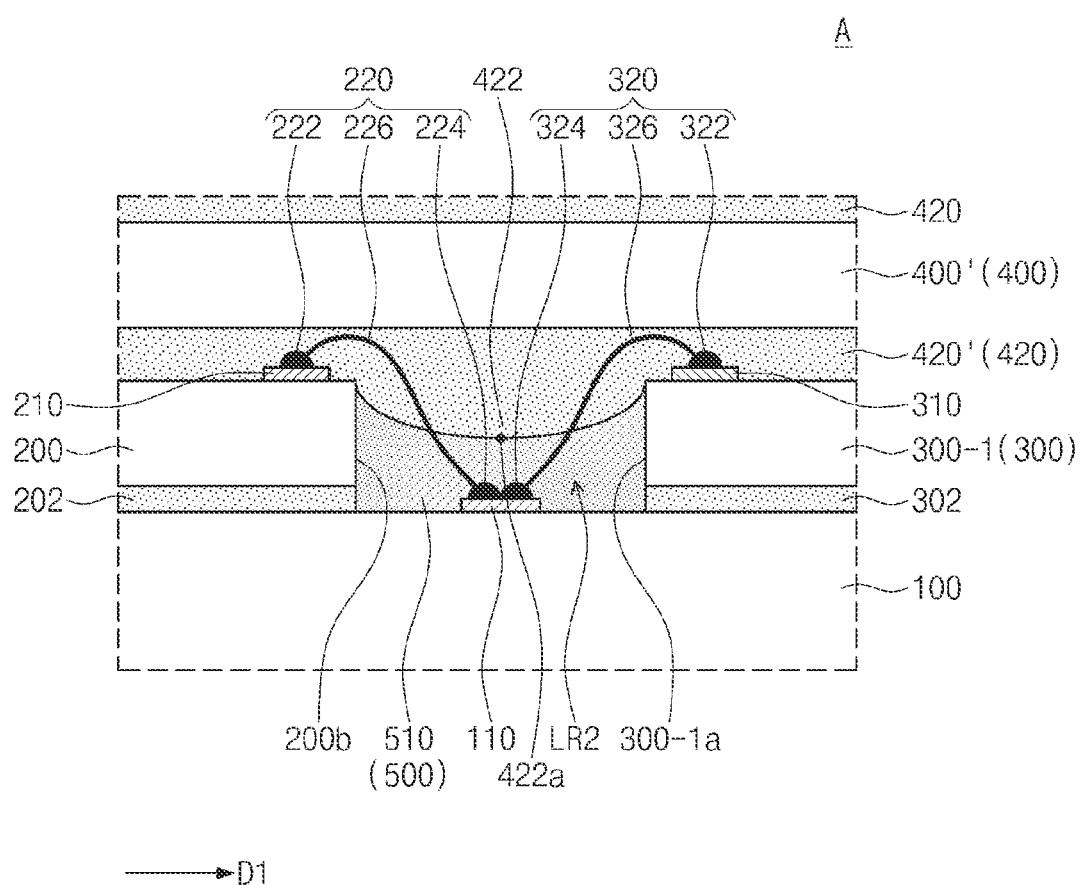

FIG. 1 is a perspective view illustrating a semiconductor package according to some embodiments of the present inventive concepts, and some components are omitted for convenience of description. FIGS. 2 and 3 are cross-sectional views illustrating a semiconductor package according to some embodiments of the present inventive concepts. FIG. 4 is a plan view illustrating a semiconductor package according to some embodiments of the present inventive concepts. FIG. 2 corresponds to a cross-section taken along line A-A' of FIG. 4, and FIG. 3 corresponds to a cross-section taken along line B-B' of FIG. 4. FIGS. 5 to 7 are enlarged cross-sectional views of section A depicted in FIG. 2, illustrating a semiconductor package according to some embodiments of the present inventive concepts.

Referring to FIGS. 1 to 4, a semiconductor package may include a substrate 100, a first semiconductor chip 200 and spacers 300 on the substrate 100, a chip stack CS on the first semiconductor chip 200 and the spacers 300, and a molding layer 500 that covers the chip stack CS.

The substrate 100 may be a printed circuit board (PCB) that has a signal pattern provided on a top surface thereon. The substrate 100 may have a structure in which one or more dielectric layers and one or more wiring layers are alternately stacked. The signal pattern may include first substrate pads 110 and second substrate pads 120. The first substrate pads 110 may be pads to which are coupled a plurality of signal wires of the first semiconductor chip 200 which will be discussed, and the second substrate pads 120 may be pads to which are coupled a plurality of signal wires of the chip stack CS which will be discussed. The substrate 100 may have external terminals 105 provided on a bottom surface thereof. The external terminals 105 may include a solder ball or a solder pad and, based on type of the external terminals 105, the semiconductor package may include one of a ball grid array (BGA) type, a fine ball-grid array (FBGA) type, and a land grid array (LGA) type.

The chip stack CS may be provided on the substrate 100. The chip stack CS may include second semiconductor chips 400 stacked on the substrate 100. The second semiconductor chips 400 may be memory chips. The second semiconductor chips 400 may be disposed in an offset stack structure. For example, the second semiconductor chips 400 may be stacked obliquely in a first direction D1, which may result in an ascending stepwise shape. The second semiconductor chips 400 may be connected to each other through chip stack signal wires 415. An adhesive layer 420 may be provided between the second semiconductor chips 400. The second semiconductor chips 400 may be attached to top surfaces of their underlying second semiconductor chips 400 through the adhesive layers 420 provided on bottom surfaces of the overlying second semiconductor chips 400. A lowermost second semiconductor chip 400' may be attached through (i.e., by) the adhesive layer 420' provided on a bottom surface thereof to a top surface 200a of the first semiconductor chip 200 and top surfaces of the spacers 300. As the second semiconductor chips 400 are stepwise stacked, the top surfaces of the second semiconductor chips 400 may be partially exposed (i.e., may each include a portion that does not have another second semiconductor chip 400 thereon). The top surfaces may be active surfaces of the second semiconductor chips 400. For example, the exposed top surfaces of the second semiconductor chips 400 may be provided thereon with chip stack pads 410 in contact with the chip stack signal wires 415.

The second semiconductor chips 400 may be wire-bonded through the chip stack signal wires 415 to the substrate 100. The chip stack signal wires 415 may electrically connect the chip stack pads 410 on the second semiconductor chips 400 to the second substrate pads 120 of the substrate 100. The chip stack signal wires 415 may be disposed, from the chip stack CS, in a direction reverse to the first direction D1.

The first semiconductor chip 200 may be provided on the substrate 100. The first semiconductor chip 200 may be disposed between the substrate 100 and the chip stack CS. When viewed in plan view, the first semiconductor chip 200 may be disposed below a central portion of the lowermost second semiconductor chip 400'. For example, the first semiconductor chip 200 may be disposed spaced apart from lateral surfaces of the lowermost second semiconductor chip 400'. The first semiconductor chip 200 may be a logic chip such as a controller that controls the second semiconductor chips 400. The top surface 200a may be an active surface of the first semiconductor chip 200. The first semiconductor chip 200 may be attached through a first adhesive layer 202 to a top surface of the substrate 100.

The first semiconductor chip 200 may have chip pads 210 provided the top surface 200a thereof. The chip pads 210 may be aligned adjacent lateral surfaces of the first semiconductor chip 200. For example, the first semiconductor chip 200 may have first lateral surfaces 200b in the first direction D1, and the chip pads 210 adjacent to the first lateral surfaces 200b may be arranged in a second direction D2 that intersects the first direction D1. The first semiconductor chip 200 may have second lateral surfaces 200c in the second direction D2, and the chip pads 210 adjacent to the second lateral surfaces 200c may be arranged in the first direction D1. The chip pads 210 may surround (e.g., define a perimeter on) the top surface 200a of the first semiconductor chip 200, while being spaced apart from each other at a regular interval. An interval between neighboring chip pads 210 may range from about 50 micrometers (μm) to about 100 μm. The chip pads 210 may be signal pads that are coupled to an integrated circuit of the first semiconductor chip 200 and transmit electrical signals to the first semiconductor chip 200.

The first semiconductor chip 200 may be wire-bonded through signal wires 220 to the substrate 100. The signal wires 220 may electrically connect the chip pads 210 on the first semiconductor chip 200 to the first substrate pads 110 of the substrate 100. The first substrate pads 110 may be disposed adjacent to the first semiconductor chip 200. For example, when viewed in plan view, the first substrate pads 110 may be arranged to surround the first semiconductor chip 200. Ones of the first substrate pads 110 that are adjacent to the first lateral surfaces 200b of the first semiconductor chip 200 may be arranged in the second direction D2, and ones of the first substrate pads 110 that are adjacent to the second lateral surfaces 200c of the first semiconductor chip 200 may be arranged in the first direction D1. The first semiconductor chip 200 may be electrically connected to the substrate 100 through the first substrate pads 110 and the signal wires 220.

Each of the signal wires 220 may connect one chip pad 210 to one first substrate pad 110. The following description will be based on one signal wire 220. As shown in FIG. 5, the signal wire 220 may be stitch-bonded or ball-bonded to the chip pad 210 and the first substrate pad 110. For example, the signal wire 220 may include a first bonding part 222 attached to the chip pad 210, a second bonding part 224 attached to the first substrate pad 110, and a first wire loop 226 that connects the first bonding part 222 to the second bonding part 224. The first bonding part 222 and the second bonding part 224 may each have a ball shape or a folding shape. The first bonding part 222 and the second bonding part 224 may have respective widths greater than that of the first wire loop 226. An interval between the signal wires 220 may range from about 50 µm to about 100 µm.

Referring still to FIGS. 1 to 5, the spacers 300 may be provided on the substrate 100. The spacers 300 may be disposed between the substrate 100 and the chip stack CS. The spacers 300 may be disposed spaced apart from the first semiconductor chip 200. On the substrate 100, the spacers 300 may support the chip stack CS. The spacers 300 may be attached through second adhesive layers 302 to the substrate 100.

The first semiconductor chip 200 may be disposed below a central portion of the lowermost second semiconductor chip 400', and the spacers 300 may be disposed to surround (e.g., to define a perimeter around) the first semiconductor chip 200. For example, ones of the spacers 300 may be disposed on the first lateral surfaces 200b of the first semiconductor chip 200, and others of the spacers 300 may be disposed on the second lateral surfaces 200c of the first semiconductor chip 200. The spacers 300 may be disposed below corners of the lowermost second semiconductor chip 400'. Therefore, a weight of the chip stack CS may be uniformly distributed on the spacers 300, and the chip stack CS may be evenly supported. Moreover, as the spacers 300 are disposed to surround the first semiconductor chip 200, a weight of the chip stack CS may be prevented/inhibited from being concentrated on the first semiconductor chip 200, and the first semiconductor chip 200 may be protected against external impact.

A gap between the first semiconductor chip 200 and the spacers 300 may have a grid shape when viewed in plan view. For example, the gap between the first semiconductor chip 200 and the spacers 300 may have a first line region LR1 that extends in the first direction D1 and a second line region LR2 that extends in the second direction D2. A gap between the first semiconductor chip 200 and one spacer 300-1 (referred to hereinafter as a first spacer) may be narrower than a gap between the spacers 300 or a gap between the first semiconductor chip 200 and another spacer 300-2 (referred to hereinafter as a second spacer). For convenience of description, the second line region LR2 is defined to refer to a relatively narrower gap, and the first line region LR1 is defined to refer to a relatively wider gap. A range of about 500 µm to about 1,000 µm may be given as an interval between the first semiconductor chip 200 and the first spacer 300-1 that face each other across the second line region LR2. An interval between the first semiconductor chip 200 and the second spacer 300-2 that face each other across the first line region LR1 may be greater than the interval between the first semiconductor chip 200 and the first spacer 300-1, and a range of about 500 µm to about 1,000 µm may be given as the interval between the first semiconductor chip 200 and the second spacer 300-2.

The first substrate pads 110 may be positioned in the first line region LR1 and the second line region LR2. For example, the first substrate pads 110 may be provided between the first semiconductor chip 200 and the first spacer 300-1 and between the first semiconductor chip 200 and the second spacer 300-2.

First dummy pads 310 may be provided on the first spacer 300-1 of the spacers 300. For example, the first dummy pads 310 may be provided on a top surface of the first spacer 300-1 that is adjacent the first semiconductor chip 200 across the second line region LR2. The first dummy pads 310 may be aligned with each other adjacent (e.g., near and in parallel with) a lateral surface of the first spacer 300-1. For example, the first spacer 300-1 may have a third lateral surface 300-1a that faces the first semiconductor chip 200, and the first dummy pads 310 adjacent to the third lateral surface 300-1a may be arranged in the second direction D2. A range of about 50 µm to about 100 µm may be given as an interval between neighboring first dummy pads 310. The first dummy pads 310 may be dummy (e.g., insulating) pads which are electrically insulated from the first spacer 300-1 and which have no electrical signal communication with the first spacer 300-1.

The first dummy pads 310 may be wire-bonded through first dummy wires 320 to the substrate 100. The first dummy wires 320 may be coupled to the first dummy pads 310 of the first spacer 300-1 and the first substrate pads 110 of the substrate 100. In this case, one first substrate pad 110 may be concurrently coupled to one signal wire 220 and one first dummy wire 320. Since the first dummy pads 310 are electrically insulated from the first spacer 300-1, even when one first substrate pad 110 is shared by one of the first dummy wires 320 and one of the signal wires 220, no electrical connection may be established between the first semiconductor chip 200 and the first spacer 300-1, and no electrical signal may be externally leaked from the first semiconductor chip 200.

Each of the first dummy wires 320 may connect one first dummy pad 310 to one first substrate pad 110. The following example is based on one first dummy wire 320. As shown in FIG. 5, the first dummy wire 320 may be stitch-bonded or ball-bonded to the first dummy pad 310 and the first substrate pad 110. For example, the first dummy wire 320 may include a third bonding part 322 attached to the first dummy pad 310, a fourth bonding part 324 attached to the first substrate pad 110, and a second wire loop 326 that connects the third bonding part 322 to the fourth bonding part 324. The third bonding part 322 and the fourth bonding part 324 may each have a ball shape or a folding shape. The third bonding part 322 and the fourth bonding part 324 may have respective widths greater than that of the second wire loop 326. An interval between the first dummy wires 320 may range from about 50 µm to about 100 µm.

FIG. 5 depicts that one first substrate pad 110 is shared by one of the first dummy wires 320 and one of the signal wires 220, but the present inventive concepts are not limited thereto. As illustrated in FIG. 6, the signal pattern of the substrate 100 may include the first substrate pads 110 and the second substrate pads 120, and may further include third substrate pads 130. The third substrate pads 130 may be pads to which the first dummy wires 320 are coupled. The third substrate pads 130 may be disposed adjacent to the first spacer 300-1. For example, between the first semiconductor chip 200 and the first spacer 300-1, the first substrate pads 110 may be disposed adjacent to the first lateral surface 200b of the first semiconductor chip 200, and the third substrate pads 130 may be disposed adjacent to a third lateral surface 300-1a of the first spacer 300-1, which third lateral surface 300-1a faces the first semiconductor chip 200. The third substrate pads 130 may be arranged in the second direction D2. The third substrate pads 130 may be spaced apart in the first direction D1 from the first substrate pads 110.

Each of the first dummy wires 320 may connect one first dummy pad 310 to one third substrate pad 130. As shown in FIG. 6, the first dummy wire 320 may be stitch-bonded or ball-bonded to the first dummy pad 310 and the third substrate pad 130. For example, the first dummy wire 320 may include a third bonding part 322 attached to the first dummy pad 310, a fourth bonding part 324 attached to the third substrate pad 130, and a second wire loop 326 that connects the third bonding part 322 to the fourth bonding part 324. The following will focus on the embodiment of FIG. 5.

Referring again to FIGS. 1 to 5, the signal wires 220 and the first dummy wires 320 may have respective portions positioned in the adhesive layer 420' of the lowermost second semiconductor chip 400'. For example, the adhesive layer 420' of the lowermost second semiconductor chip 400' may be in contact with the top surface 200a of the first semiconductor chip 200 and the top surfaces of the spacers 300, and in this case, the chip pads 210 and the first dummy pads 310 may be buried in the adhesive layer 420'. The adhesive layer 420' may have therein the first bonding parts 222 of the signal wires 220 coupled to the chip pads 210 and portions of the first wire loops 226 that extend from the first bonding parts 222. The adhesive layer 420' may also have therein the third bonding parts 322 of the first dummy wires 320 coupled to the first dummy pads 310 and portions of the second wire loops 326 that extend from the third bonding parts 322. Moreover, the first lateral surface 200b of the first semiconductor chip 200 and the third lateral surface 300-1a of the first spacer 300-1 may each be spaced apart from (e.g., entirely free of contact with) the adhesive layer 420'.

Between the first semiconductor chip 200 and the first spacer 300-1, or on the second line region LR2, the adhesive layer 420' may have a bottom surface having an interface with (e.g., at the same level as that of) the top surface 200a of the first semiconductor chip 200. Alternatively, as illustrated in FIG. 7, the adhesive layer 420' may have a portion 422 (referred to hereinafter as a first protrusion) that protrudes between the first semiconductor chip 200 and the first spacer 300-1. The first protrusion 422 of the adhesive layer 420' may have a lowermost end/point 422a at a level higher than that of an intermediate (e.g., halfway) point between the top surface of the substrate 100 and the top surface 200a of the first semiconductor chip 200. According to the present inventive concepts, as the second line region LR2 having a small width is provided thereon with the adhesive layer 420' that does not protrude or only slightly protrudes between the first semiconductor chip 200 and the first spacer 300-1, the molding layer 500 may easily introduced into a space between the first semiconductor chip 200 and the first spacer 300-1 in a subsequent fabrication process for a semiconductor package. This will be discussed below in detail together with a method of fabricating a semiconductor package.

Between the first semiconductor chip 200 and the second spacer 300-2 and between the first spacer 300-1 and the second spacer 300-2, or on the first line region LR1 and a third line region LR3, the adhesive layer 420' may have a bottom surface at a level lower than that of the top surface 200a of the first semiconductor chip 200. As illustrated in FIG. 3, the adhesive layer 420' may have a portion 424 (referred to hereinafter as a second protrusion) that protrudes between the first spacer 300-1 and the second spacer 300-2.

Referring again to FIGS. 1 to 5, the molding layer 500 may be provided to cover the chip stack CS and the top surface of the substrate 100. A portion 510 of the molding layer 500 may fill a gap between the first semiconductor chip 200 and the spacers 300. For example, when a semiconductor package is fabricated, a dielectric polymer material may be introduced into a gap between the first semiconductor chip 200 and the spacers 300, or into the first line region LR1, the second line region LR2, and the third line region LR3, thereby forming the molding layer 500. For example, a gap between the first semiconductor chip 200 and the spacers 300 may be a flow path to which a polymeric material is introduced. On the second line region LR2, the portion 510 of the molding layer 500 may fill a space between the first semiconductor chip 200 and the first spacer 300-1, and may contact a bottom surface of the first protrusion 422 of the adhesive layer 420'. On the first line region LR1, the portion 510 of the molding layer 500 may fill a space between the first semiconductor chip 200 and the second spacer 300-2, and may contact a bottom surface of the second protrusion 424 of the adhesive layer 420'. The portion of the molding layer 500 may surround the first semiconductor chip 200. The molding layer 500 may include a dielectric polymer material, such as an epoxy molding compound (EMC).

According to some embodiments of the present inventive concepts, the portion 510 of the molding layer 500 may surround the first semiconductor chip 200, and may completely fill a space between the first semiconductor chip 200 and the spacers 300. Therefore, the molding layer 500 may protect the first semiconductor chip 200, and a semiconductor package may be provided to have increased structural stability.

The semiconductor package may be provided as discussed above.

Figure 8:
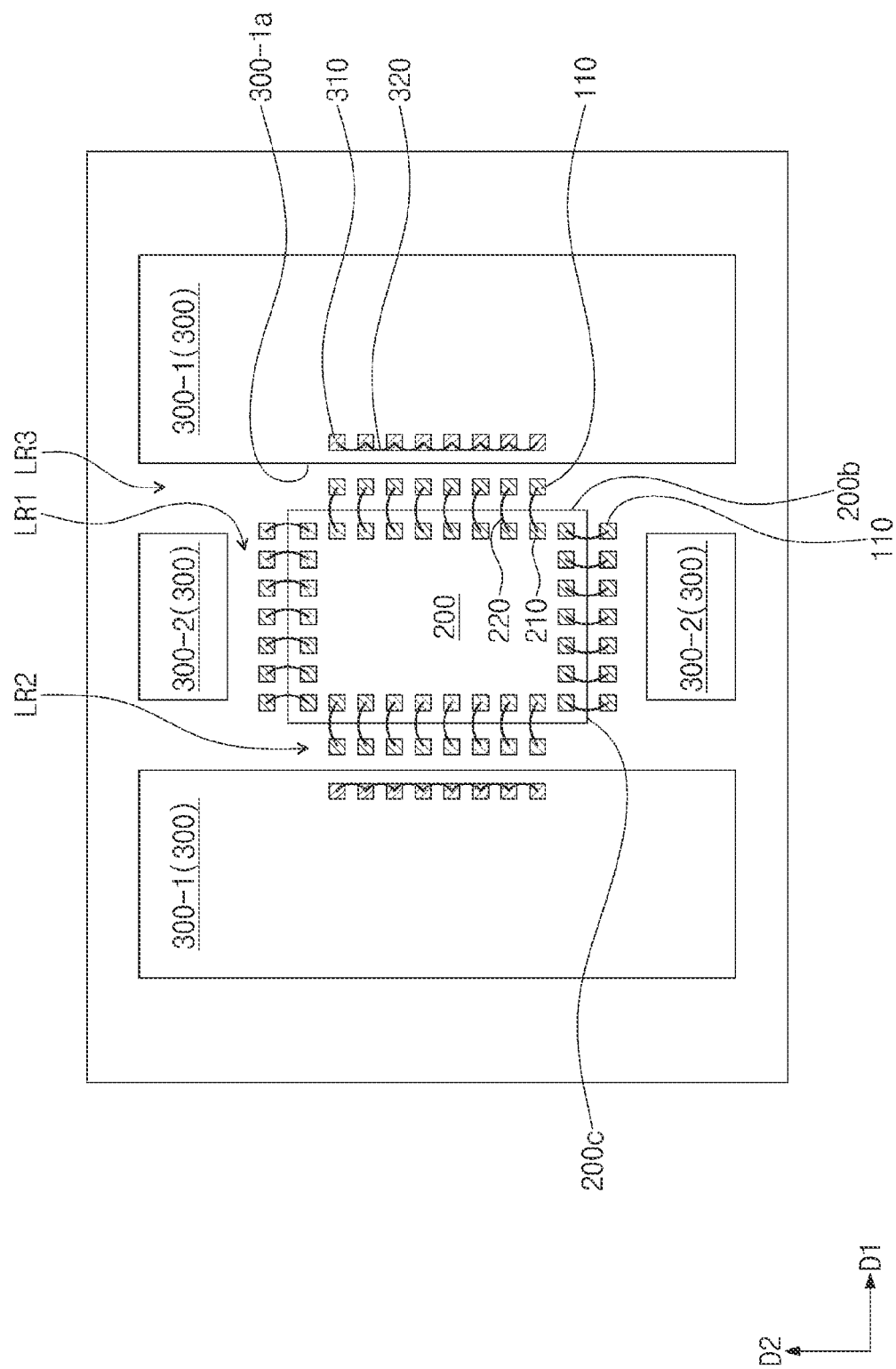
FIG. 8 is a plan view illustrating a semiconductor package according to some embodiments of the present inventive concepts.
Figure 9:
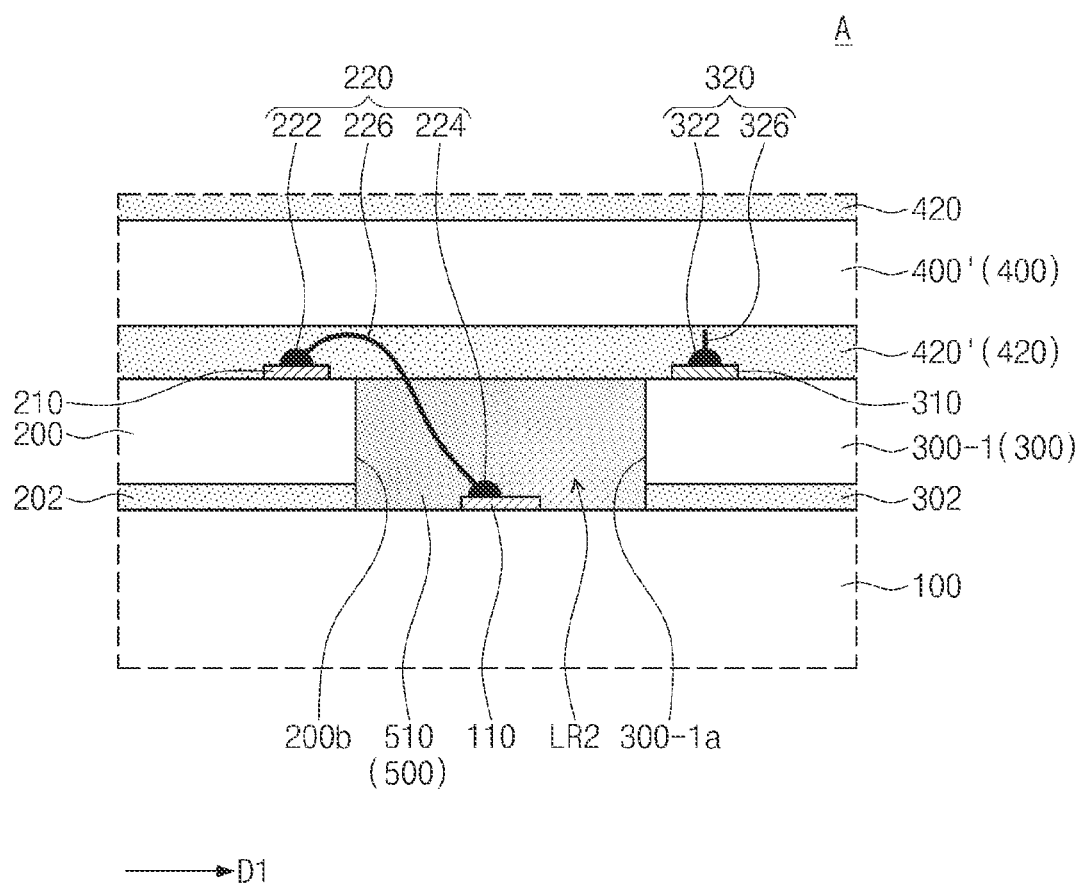
FIG. 9 is an enlarged cross-sectional view of FIG. 8 illustrating a semiconductor package according to some embodiments of the present inventive concepts.

FIG. 8 is a cross-sectional view illustrating a semiconductor package according to some embodiments of the present inventive concepts. FIG. 9 is an enlarged cross-sectional view of FIG. 8 illustrating a semiconductor package according to some embodiments of the present inventive concepts. In the embodiment that follows, for convenience of description, components the same as those discussed with reference to FIGS. 1 and 7 are allocated the same reference numerals thereto, and a repetitive explanation thereof will be omitted or abridged.

Referring to FIGS. 8 and 9, the first dummy wires 320 may be coupled to the first dummy pads 310 that neighbor each other. For example, the first dummy wire 320 may include a third bonding part 322 coupled to the first dummy pad 310 and a second wire loop 326 that connects neighboring third bonding parts 322 to each other. For example, neighboring first dummy pads 310 may be connected to each other through the first dummy wires 320.

Figure 10:
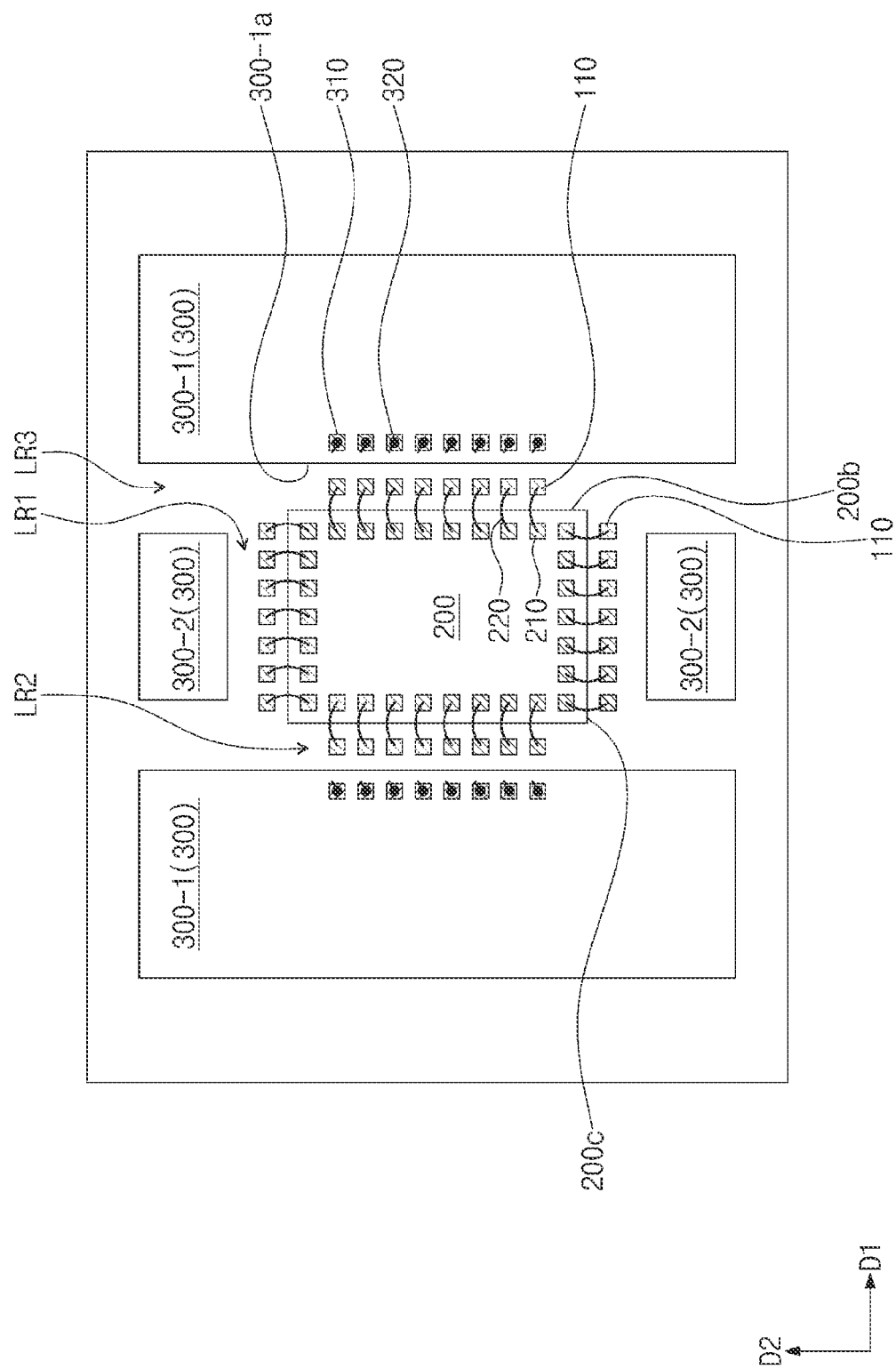
FIG. 10 is a plan view illustrating a semiconductor package according to some embodiments of the present inventive concepts.
Figure 11:
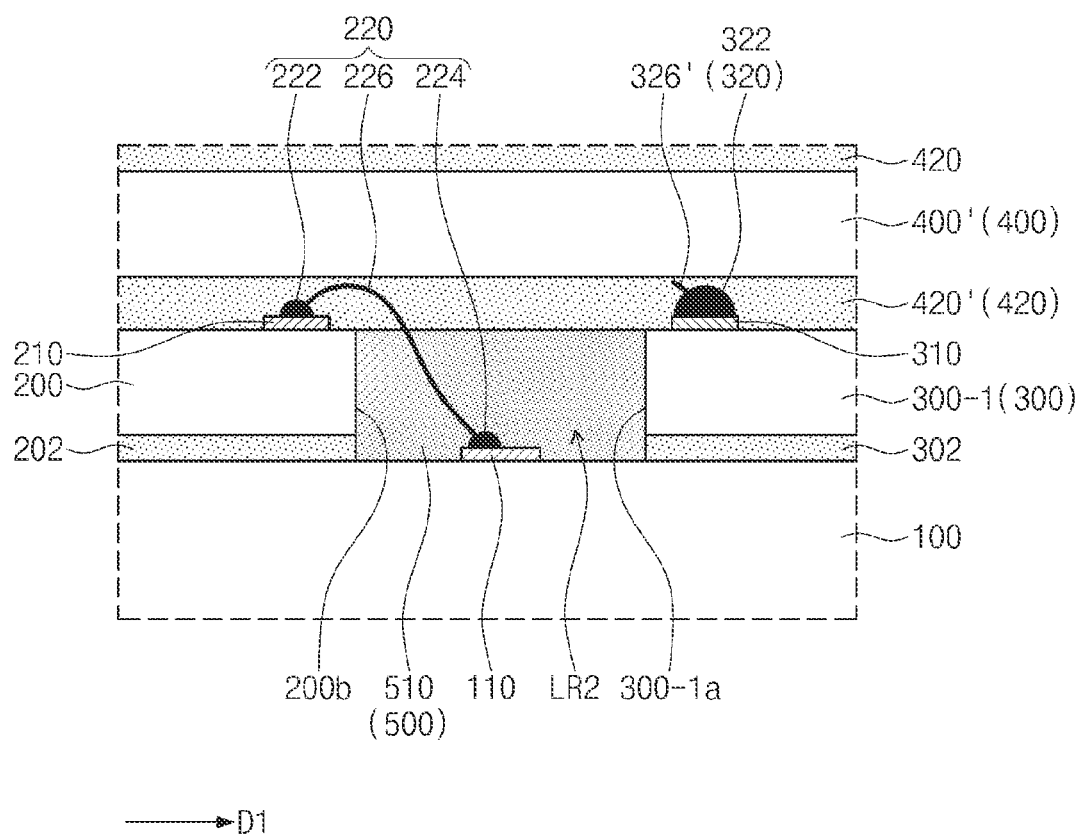
FIG. 11 is an enlarged cross-sectional view of FIG. 10 illustrating a semiconductor package according to some embodiments of the present inventive concepts.

FIG. 10 is a plan view illustrating a semiconductor package according to some embodiments of the present inventive concepts. FIG. 11 is an enlarged cross-sectional view of FIG. 10 illustrating a semiconductor package according to some embodiments of the present inventive concepts. In the embodiment that follows, for convenience of description, components the same as those discussed with reference to FIGS. 1 and 7 are allocated the same reference numerals thereto, and a repetitive explanation thereof will be omitted or abridged.

Referring to FIGS. 10 and 11, the first dummy wires 320 may be coupled to the first dummy pads 310, but not to the first substrate pads 110. For example, the first dummy wire 320 may include a third bonding part 322 coupled to the first dummy pad 310 and a second wire loop 326' that extends from the third bonding part 322. In this case, the second wire loop 326' may not extend onto the first substrate pad 110. The second wire loop 326' may have one end connected to the third bonding part 322 and other end positioned in the adhesive layer 420'. The second wire loop 326' may be either a portion of wire formed in a wire bonding process for the first dummy wires 320 or a tail segment of the third bonding part 322 formed in a stitch bonding process for the first dummy wires 320. For example, the second wire loop 326' may be a portion of the third bonding part 322, which portion may protrude from the third bonding part 322.

Figure 12:
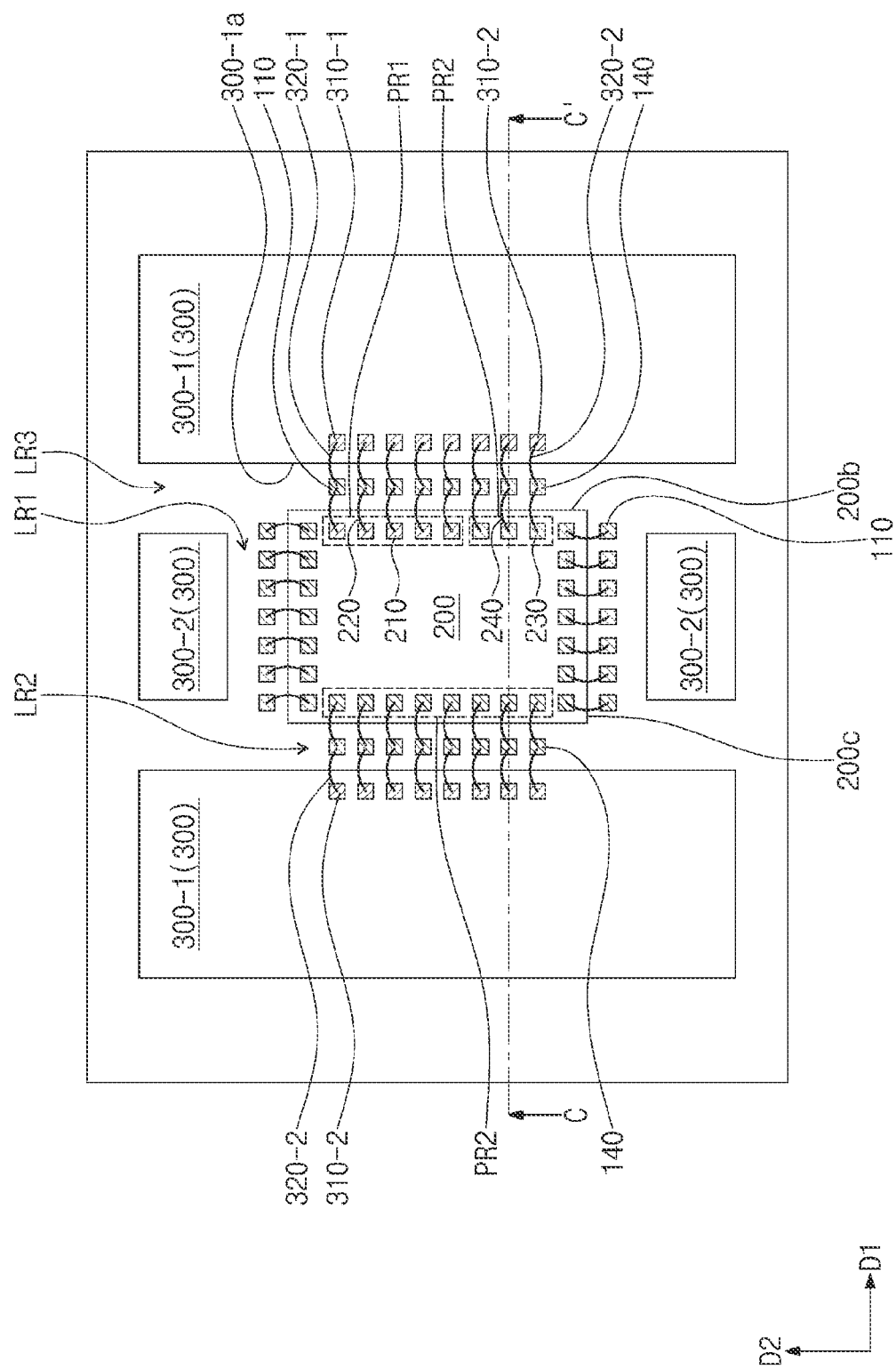
FIG. 12 is a plan view illustrating a semiconductor package according to some embodiments of the present inventive concepts.
Figure 13:
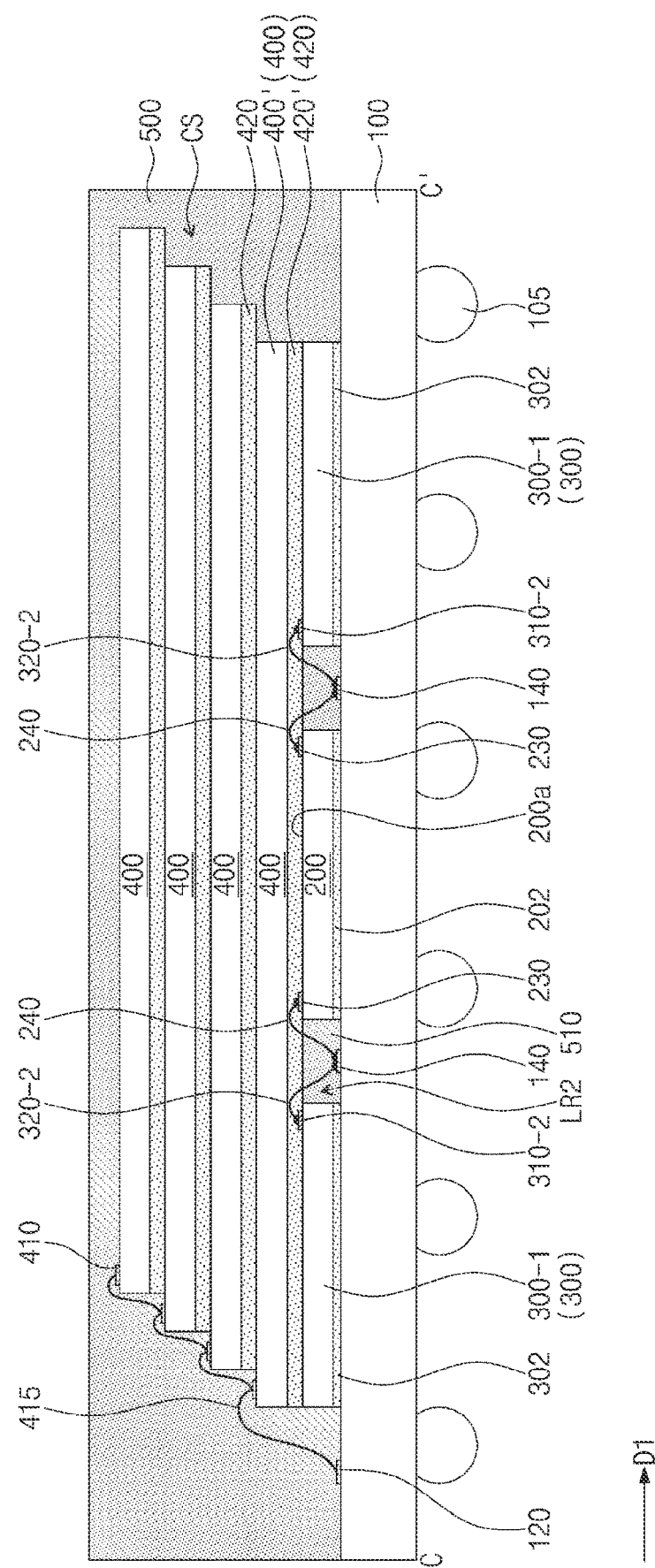
FIG. 13 is a cross-sectional view of FIG. 12 illustrating a semiconductor package according to some embodiments of the present inventive concepts.

FIG. 12 is a plan view illustrating a semiconductor package according to some embodiments of the present inventive concepts. FIG. 13 is a cross-sectional view taken along line C-C' of FIG. 12, illustrating a semiconductor package according to some embodiments of the present inventive concepts.

Referring to FIGS. 12 and 13, a region at the top surface 200a of the first semiconductor chip 200 may be free of chip pads 210. For example, the first semiconductor chip 200 may be provided on its top surface 200a with a first pad region PR1 which is adjacent to the first spacer 300-1 and on which the chip pads 210 are disposed and with a second pad region PR2 on which the chip pads 210 are not disposed. The first pad region PR1 and the second pad region PR2 may be aligned adjacent the first lateral surface 200b of the first semiconductor chip 200, and may be spaced apart from each other in the second direction D2.

Alternatively, on the top surface 200a of the first semiconductor chip 200, the chip pads 210 may not be provided on a region adjacent to the first lateral surface 200b. As illustrated on a left side of the first semiconductor chip 200 of FIG. 12, on the top surface 200a of the first semiconductor chip 200, only the second pad region PR2 may be provided on a region adjacent to the first lateral surface 200b, and the chip pads 210 may not be provided on the second pad region PR2.

Ones of the chip pads 210 may be provided on the first pad region PR1. The second pad region PR2 may have a length in the second direction D2 at least twice an interval between neighboring chip pads 210.

Ones of the chip pads 210 may be provided on the first pad region PR1. The chip pads 210 may be aligned in the second direction D2 on the first pad region PR1. An interval between the chip pads 210 may range from about 50 μm to about 100 μm.

Second dummy pads 230 may be provided on the second pad region PR2. The second dummy pads 230 may be aligned in the second direction D2 on the second pad region PR2. An interval between the second dummy pads 230 may range from about 50 μm to about 100 μm. The second dummy pads 230 may be dummy pads that have no electrical signal communication with the first semiconductor chip 200. A range of about 50 μm to about 100 μm may be given as an interval between the chip pad 210 and the second dummy pad 230 that are disposed adjacent to each other.

The first dummy pads 310 disposed on the first spacer 300-1 may have first sub-dummy pads 310-1 on a location that corresponds to that of the first pad region PR1, and also have second sub-dummy pads 310-2 on a location that corresponds to that of the second pad region PR2.

The first substrate pads 110 may be positioned between the first pad region PR1 and the first sub-dummy pads 310-1. The substrate 100 may further include fourth substrate pads 140 between the second pad region PR2 and the second sub-dummy pads 310-2. The fourth substrate pads 140 may be arranged in the second direction D2.

The first semiconductor chip 200 may be wire-bonded through the signal wires 220 to the substrate 100. The signal wires 220 may electrically connect the chip pads 210 of the first semiconductor chip 200 on the first pad region PR1 to the first substrate pads 110 of the substrate 100.

The first dummy pads 310 may be wire-bonded to the substrate 100 through portions 320-1 of the first dummy wires 320. The portions 320-1 of the first dummy wires 320 may be coupled to the first sub-dummy pads 310-1 of the first spacer 300-1 and the first substrate pads 110 of the substrate 100.

The chip pads 210 may be connected to the first sub-dummy pads 310-1 through the signal wires 220, the first substrate pads 110, and the portions 320-1 of the first dummy wires 320. In this case, the first sub-dummy pads 310-1 may be electrically insulated from the first spacer 300-1, and thus the first semiconductor chip 200 and the first spacer 300-1 may be electrically floating.

The first semiconductor chip 200 may be wire-bonded through the second dummy wires 240 to the substrate 100. The second dummy wires 240 may electrically connect the second dummy pads 230 of the first semiconductor chip 200 on the second pad region PR2 to the fourth substrate pads 140 of the substrate 100.

The first dummy pads 310 may be wire-bonded to the substrate 100 through other portions 320-2 of the first dummy wires 320. The other portions 320-2 of the first dummy wires 320 may be coupled to the second sub-dummy pads 310-2 of the first spacer 300-1 and the fourth substrate pads 140 of the substrate 100.

The second dummy pads 230 may be connected to the second sub-dummy pads 310-2 through the second dummy wires 240, the fourth substrate pads 140, and the other portions 320-2 of the first dummy wires 320. In this case, the second dummy (e.g., insulating) pads 230 may be electrically insulated from the first semiconductor chip 200, and thus the first semiconductor chip 200 and the first spacer 300-1 may be electrically floating.

According to some embodiments of the present inventive concepts, the second dummy pads 230 and the second dummy wires 240 may also be provided on the top surface 200a of the first semiconductor chip 200 on which the chip pads 210 are provided, and thus in a semiconductor package fabrication which will be discussed below, it may be possible to prevent/inhibit the lowermost adhesive layer 420' from forming on lateral surfaces of the first semiconductor chip 200 after passing through the chip pads 210 and the second dummy pads 230, to allow the first semiconductor chip 200 and the first spacer 300-1 to have therebetween a space to receive the molding layer 500, and to cause the molding layer 500 to easily enter the space between the first semiconductor chip 200 and the first spacer 300-1. This will be discussed below in detail together with a method of fabricating a semiconductor package.

FIGS. 14 to 20 are cross-sectional views illustrating a method of fabricating a semiconductor package according to some embodiments of the present inventive concepts. FIG. 21 is a plan view illustrating a method for fabricating a semiconductor package according to some embodiments of the present inventive concepts. FIG. 22 is a cross-sectional view illustrating a method for fabricating a semiconductor package according to some embodiments of the present inventive concepts.

Figure 14:
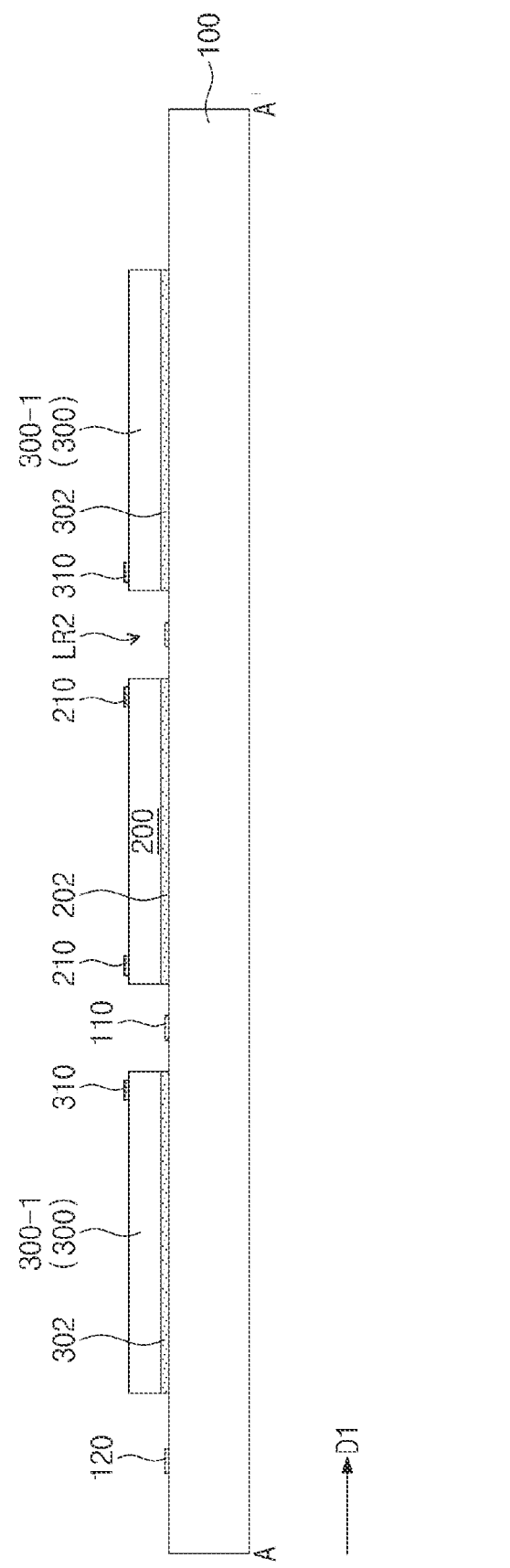
FIGS. 14 to 20 are cross-sectional views illustrating a method of fabricating a semiconductor package according to some embodiments of the present inventive concepts.

Referring to FIGS. 4 and 14, a substrate 100 may be provided. The substrate 100 may be a printed circuit board (PCB) that has a signal pattern provided on a top surface thereon. The substrate 100 may include, for example, first substrate pads 110 and second substrate pads 120.

A first semiconductor chip 200 and spacers 300 may be attached to the substrate 100. For example, a first adhesive layer 202 may be provided on an inactive surface of the first semiconductor chip 200. The first semiconductor chip 200 may be attached through the first adhesive layer 202 to a top surface of the substrate 100. The first semiconductor chip 200 may be attached between the first substrate pads 110 of the substrate 100. For example, when viewed in plan view, the first substrate pads 110 may surround the first semiconductor chip 200. The first semiconductor chip 200 may have a top surface or an active surface. For example, the first semiconductor chip 200 may have first chip pads 210 provided on the top surface thereof. A second adhesive layer 302 may be provided on one surface of each of the spacers 300. The spacers 300 may each be attached through the second adhesive layer 302 to the top surface of the substrate 100. First dummy pads 310 may be provided on a top surface of a first spacer 300-1 included among the spacers 300. The first dummy pads 310 on the top surface of the first spacer 300-1 may be disposed adjacent to the first semiconductor chip 200. Ones of the first substrate pads 110 may be positioned between the first semiconductor chip 200 and the first spacer 300-1.

Figure 15:
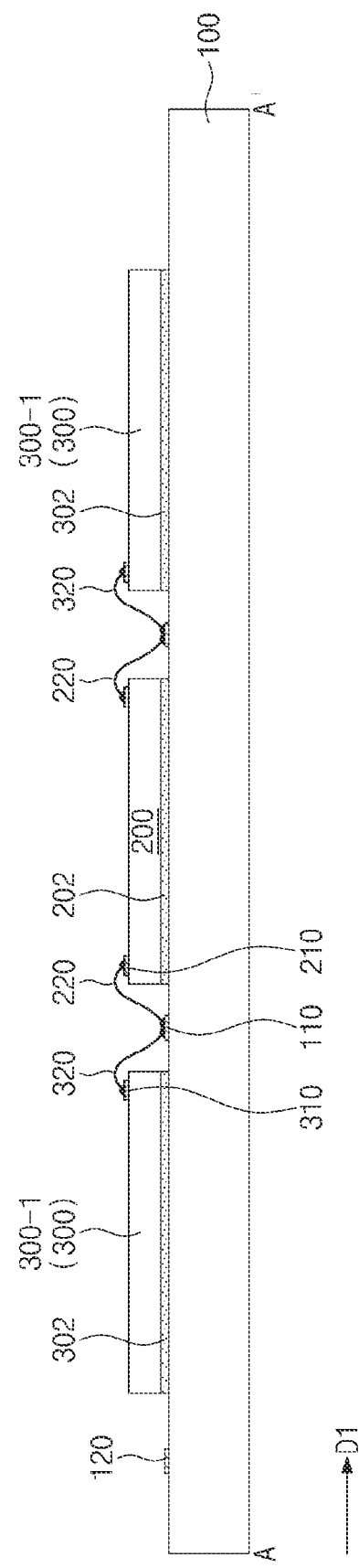

Referring to FIGS. 4 and 15, the first semiconductor chip 200 may be wire-bonded to the substrate 100. For example, a capillary may be provided on the chip pad 210 of the first semiconductor chip 200. The capillary may melt a wire introduced thereinto to form a ball at a bottom end of the capillary. The capillary may travel toward the chip pad 210 to attach the ball to the chip pad 210. The ball attached to the chip pad 210 may correspond to the first bonding part 222 discussed with reference to FIG. 5. The capillary may move onto the first substrate pad 110. The wire that extends from the capillary may form the first wire loop 226 discussed with reference to FIG. 5. The capillary may form a ball, which is attached to the first substrate pad 110, at an end of the first wire loop 226. The ball attached to the first substrate pad 110 may correspond to the second bonding part 224 discussed with reference to FIG. 5. As such, signal wires 220 may be formed to connect the chip pads 210 to the first substrate pads 110.

First dummy wires 320 may be formed in the wire bonding process in which the signal wires 220 are formed. For example, while the capillary moves toward the first substrate pad 110 from the first dummy pad 310 of the first spacer 300-1, the capillary may form the third bonding part (see 322 of FIG. 5) attached to the first dummy pad 310, the second wire loop (see 326 of FIG. 5) that extends from the third bonding part 322 toward the first substrate pad 110, and the fourth bonding part (see 324 of FIG. 5) on the first substrate pad 110.

Figure 16:
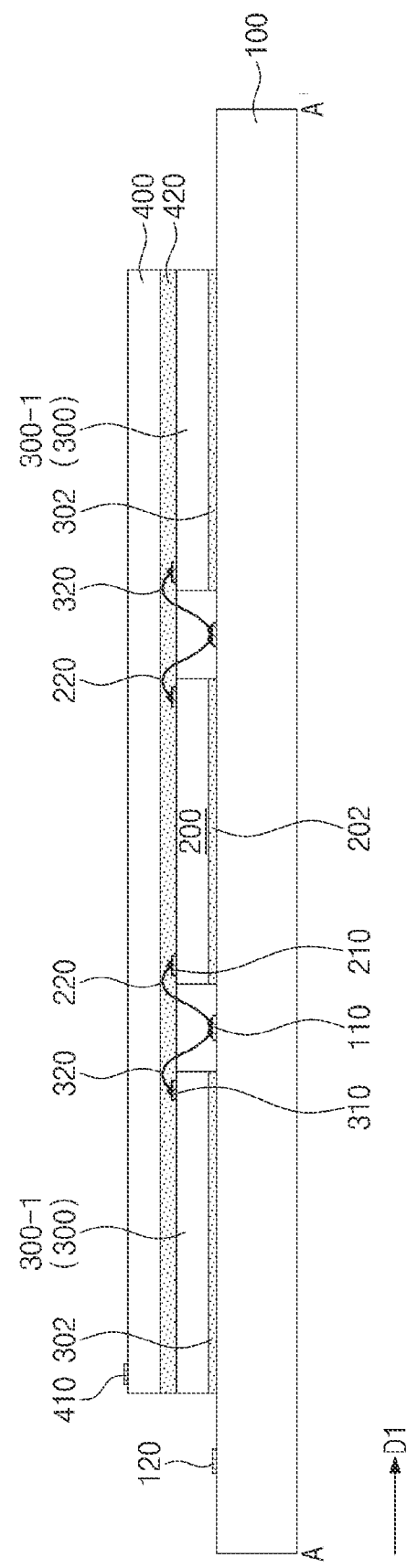

Referring to FIGS. 4 and 16, a second semiconductor chip 400 may be provided on the first semiconductor chip 200 and the spacers 300. For example, an adhesive layer 420 may be provided on an inactive surface of the second semiconductor chip 400. The adhesive layer 420 of the second semiconductor chip 400 may be in contact with the top surface of the first semiconductor chip 200 and the top surfaces of the spacers 300. The adhesive layer 420 may receive therein the chip pads 210 of the first semiconductor chip 200, portions of the signal wires 220, the first dummy pads 310 of the first spacer 300-1, and portions of the first dummy wires 320. The second semiconductor chip 400 may have a top surface or an active surface. For example, the second semiconductor chip 400 may have chip stack pads 410 provided on the top surface thereof.

Figure 17:
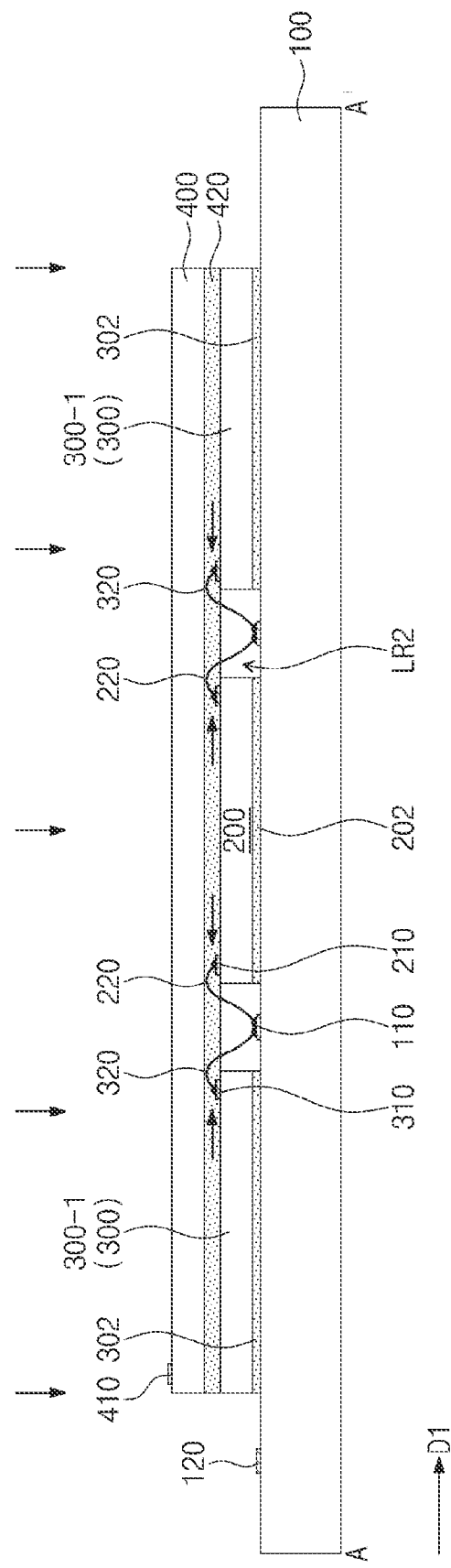

Referring to FIGS. 4 and 17, the second semiconductor chip 400 may undergo a thermo-compression process to attach the second semiconductor chip 400 to the top surface of the first semiconductor chip 200 and the top surfaces of the spacers 300. For example, the thermo-compression process may be performed such that the adhesive layer 420 is melted by heat generated from the thermo-compression process, and that the adhesive layer 420 is completely attached to the top surface of the first semiconductor chip 200 and the top surfaces of the spacers 300. Afterwards, the adhesive layer 420 may be cured to rigidly attach the second semiconductor chip 400 to the first semiconductor chip 200 and the spacers 300.

When the thermo-compression process is performed, as indicated by arrows shown in FIG. 17, the melted adhesive layer 420 may be externally discharged from a space between the second semiconductor chip 400 and the first semiconductor chip 200 and between the second semiconductor chip 400 and the spacers 300.

According to some embodiments of the present inventive concepts, the first semiconductor chip 200 may be provided on its top surface with the chip pads 210 and the signal wires 220 along an outer portion of the first semiconductor chip 200. The chip pads 210 and the signal wires 220 may interrupt flow of the melted adhesive layer 420. Therefore, the melted adhesive layer 420 may be prevented/inhibited from being introducing from a space between the first and second semiconductor chips 200 and 400 into a space (or a second line region LR2) between the first semiconductor chip 200 and the first spacer 300-1 and into a space (or a first line region LR1) between the first semiconductor chip 200 and a second spacer 300-2.

According to some embodiments of the present inventive concepts, the first spacer 300-1 may be provided on its top surface with the first dummy pads 310 and the first dummy wires 320, which pads 310 and wires 320 are adjacent to the first semiconductor chips 200. The first dummy pads 310 and the first dummy wires 320 may interrupt flow of the melted adhesive layer 420. The melted adhesive layer 420 may thus be prevented/inhibited from being introducing from a space between the first spacer 300-1 and the second semiconductor chip 400 into the space (or the second line region LR2) between the first semiconductor chip 200 and the first spacer 300-1. Therefore, between the first semiconductor chip 200 and the spacers 300, the melted adhesive layer 420 may be prevented/inhibited from being introduced into the second line region LR2 having a small width.

Figure 18:
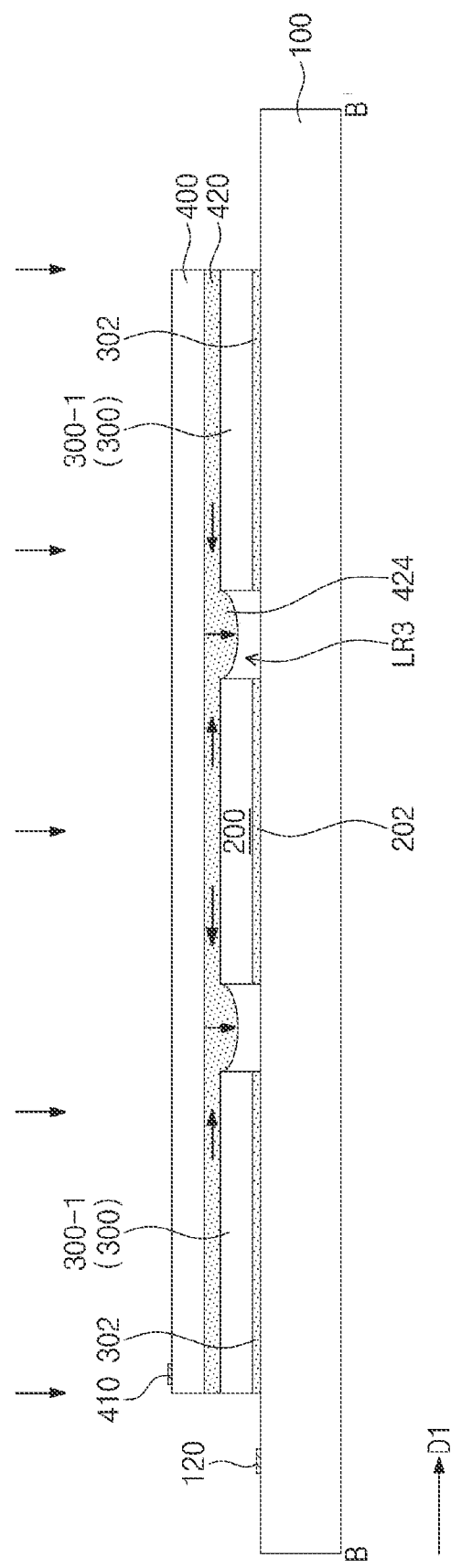

When the thermal-compression process is performed, as shown in FIG. 18, the melted adhesive layer 420 may be introduced into a space between the first spacer 300-1 and the second spacer 300-2. For example, neither dummy pads nor dummy wires may be provided on a top surface of the second spacer 300-2. The melted adhesive layer 420 may be introduced into a space (or a third line region LR3) between the first and second spacers 300-1 and 300-2 from a space between the first spacer 300-1 and the second semiconductor chip 400 and from a space between the second spacer 300-2 and the second semiconductor chip 400. Thus, the adhesive layer 420 may include a second protrusion 424 that protrudes between the first and second spacers 300-1 and 300-2.

Figure 19:
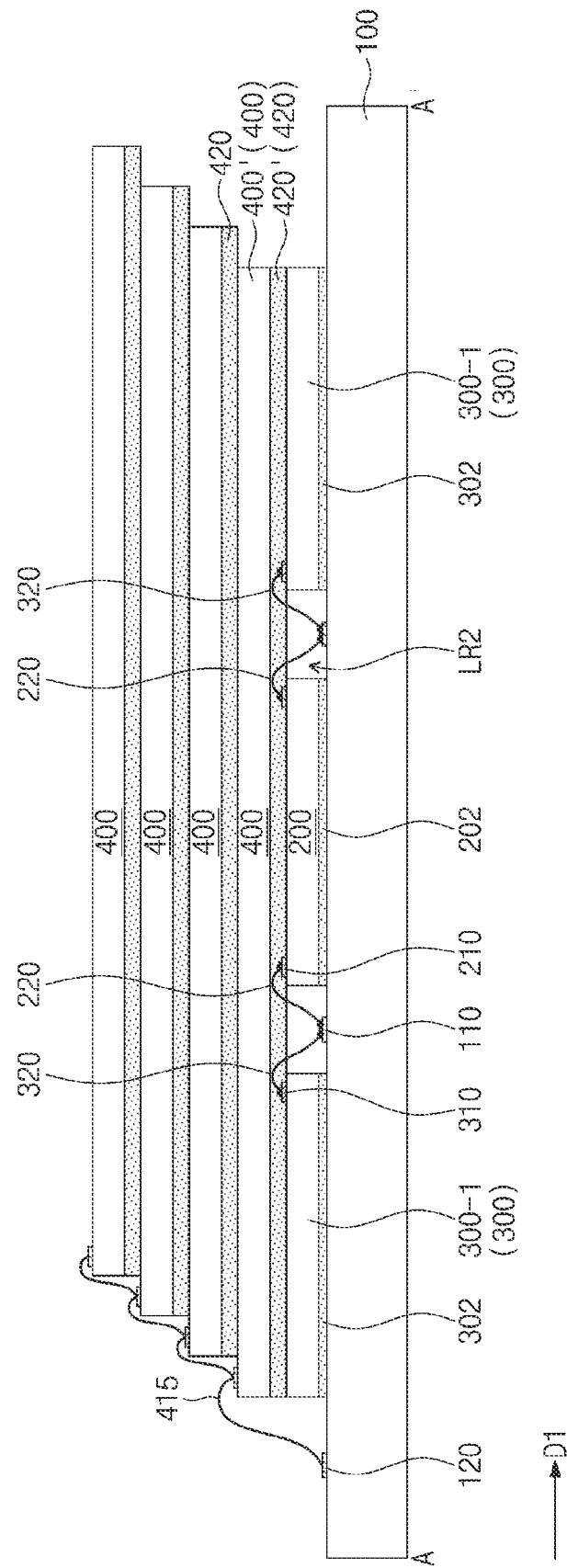

Referring to FIGS. 4 and 19, a plurality of second semiconductor chips 400 may be stacked on a second semiconductor chip 400' attached to the first semiconductor chip 200 and the spacers 300. For example, an adhesive layer 420 may be provided on an inactive surface of the second semiconductor chip 400. The adhesive layer 420 of the second semiconductor chip 400 may be in contact with a top surface of the lowermost second semiconductor chip 400'. The way mentioned above may be executed to stack a plurality of second semiconductor chips 400. The second semiconductor chips 400 may be stacked in an offset stack structure. The second semiconductor chip 400 may have respective top surfaces or active surfaces. Thus, the second semiconductor chips 400 may expose the chip stack pads 410.

After that, the second semiconductor chips 400 may be wire-bonded to the substrate 100. Chip stack signal wires 415 may connect the chip stack pads 410 to the second substrate pads 120 of the substrate 100.

Figure 20:
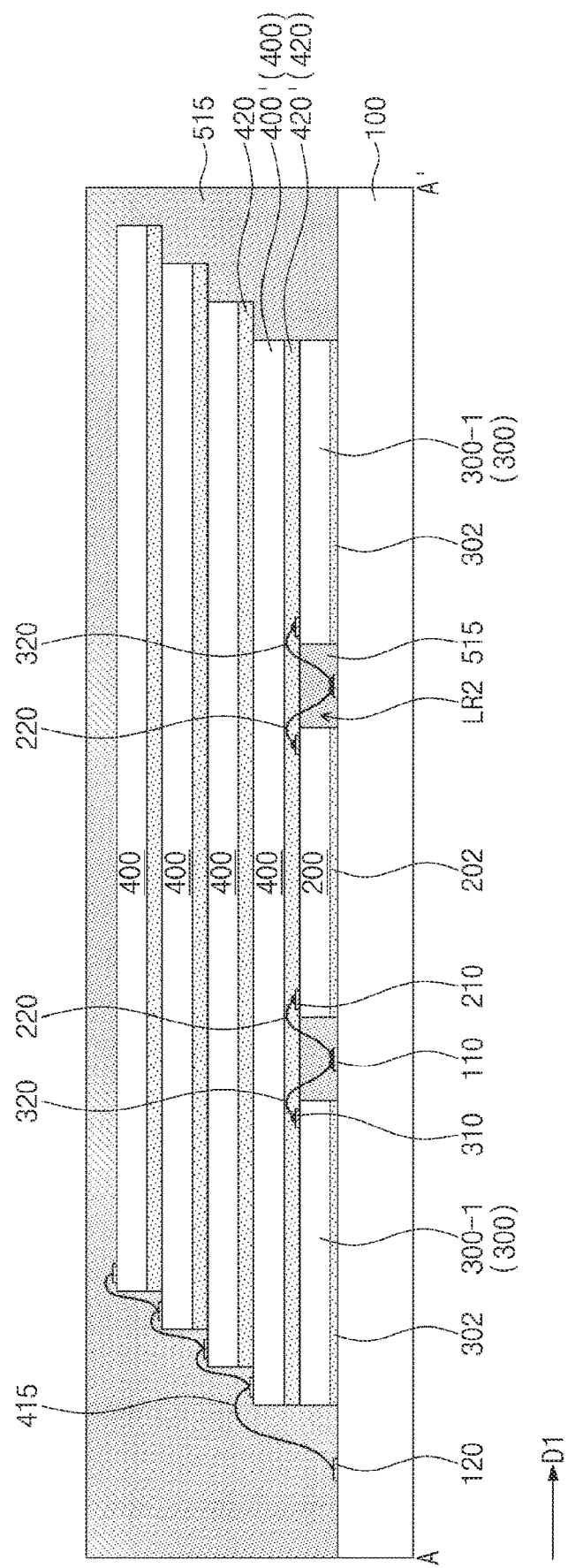
Figure 21:
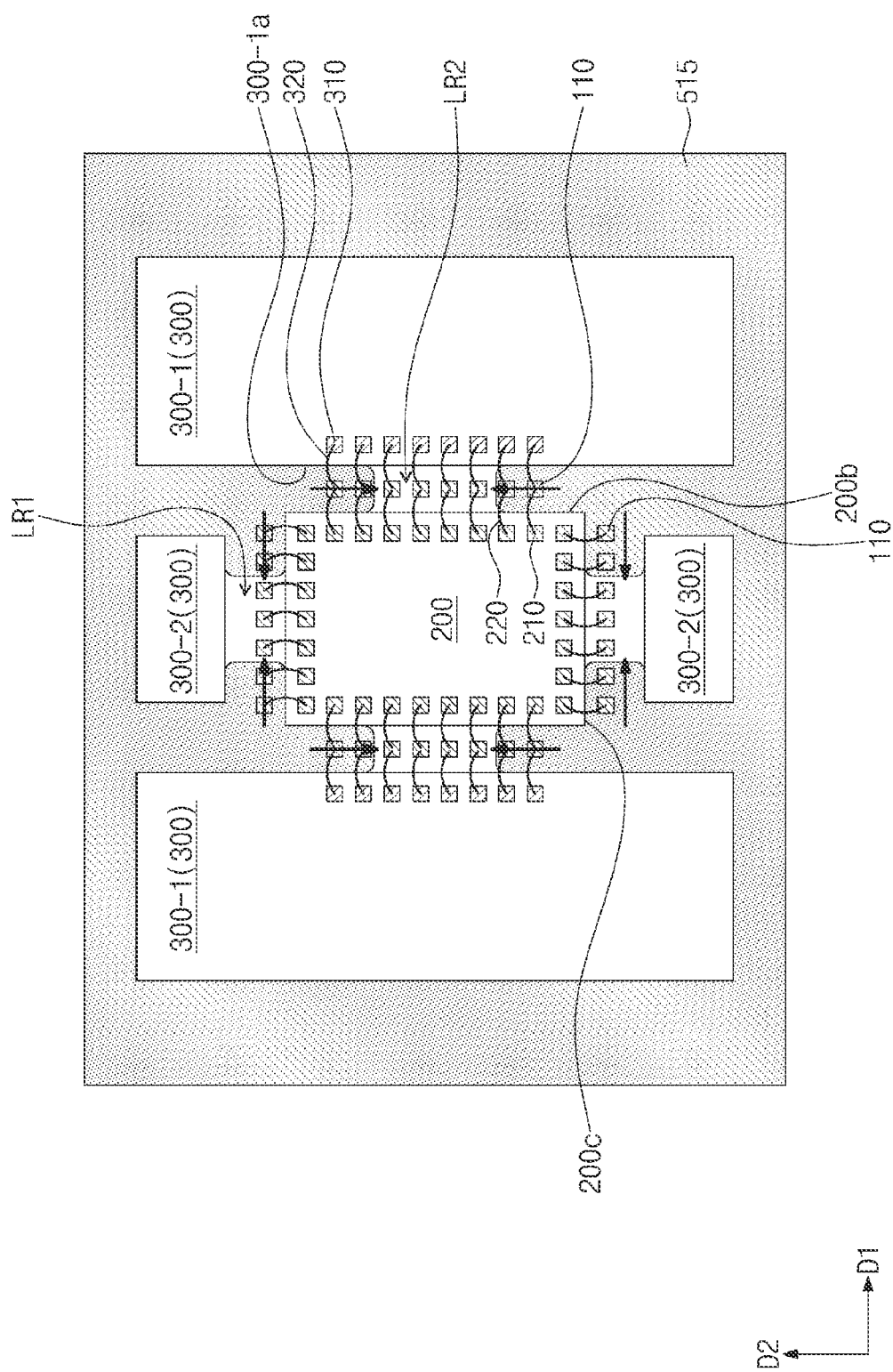
FIG. 21 is a plan view illustrating a method for fabricating a semiconductor package according to some embodiments of the present inventive concepts.
Figure 22:
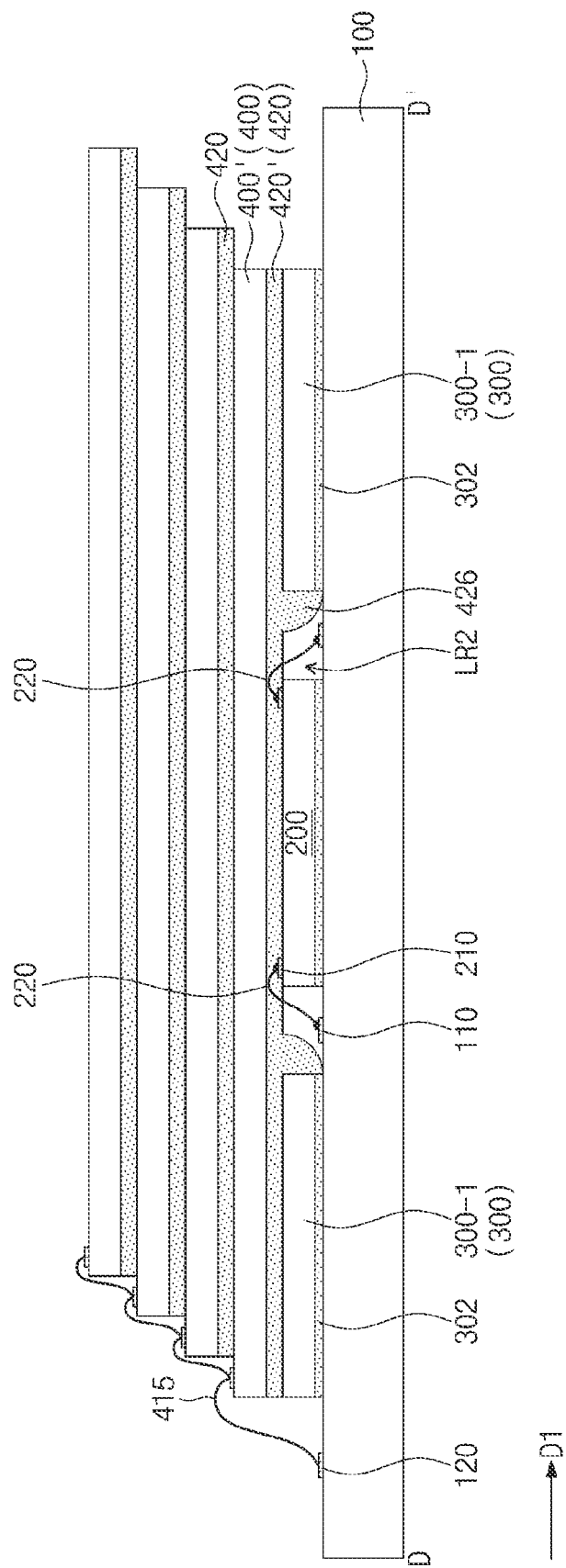
FIG. 22 is a cross-sectional view of FIG. 23 illustrating a method for fabricating a semiconductor package according to some embodiments of the present inventive concepts.

Referring to FIGS. 4, 20, and 21, a molding layer (see 500 of FIG. 2) may be formed on the substrate 100. For example, a molding member 515 may be coated on the substrate 100, covering the second semiconductor chips 400 and the top surface of the substrate 100. In this case, as shown in FIG. 21, the molding member 515 may fill a space between the first semiconductor chip 200 and the spacers 300. For example, as indicated by arrows depicted in FIG. 21, the molding member 515 may be introduced into a space between the first spacer 300-1 and the second spacer 300-2 and between the first semiconductor chip 200 and the spacers 300. The molding member 515 may flow parallel to the top surface of the substrate 100. On the second line region LR2 having a small width, the adhesive layer 420' may not protrude between the first semiconductor chip 200 and the first spacer 300-1, and thus the molding member 515 may have lower resistance to its flow than it would if the adhesive layer 420' instead protruded between the first semiconductor chip 200 and the first spacer 300-1. Therefore, the molding member 515 may be easily introduced, and the first line region LR1 may be filled with the molding member 515 to reduce the occurrence of a void, such as an air gap, between the first semiconductor chip 200 and the first spacer 300-1. On the first line region LR1 having a large width, even when a portion of the adhesive layer 420' protrudes between the first semiconductor chip 200 and the second spacer 300-2, the first line region LR1 may have a space sufficient enough to receive the molding member 515 introduced thereinto. Therefore, the first line region LR1 may be filled with the molding member 515 to reduce the occurrence of a void between the first semiconductor chip 200 and the second spacer 300-2.

Afterwards, the molding member 515 may be cured to form the molding layer 500.

Figure 23:
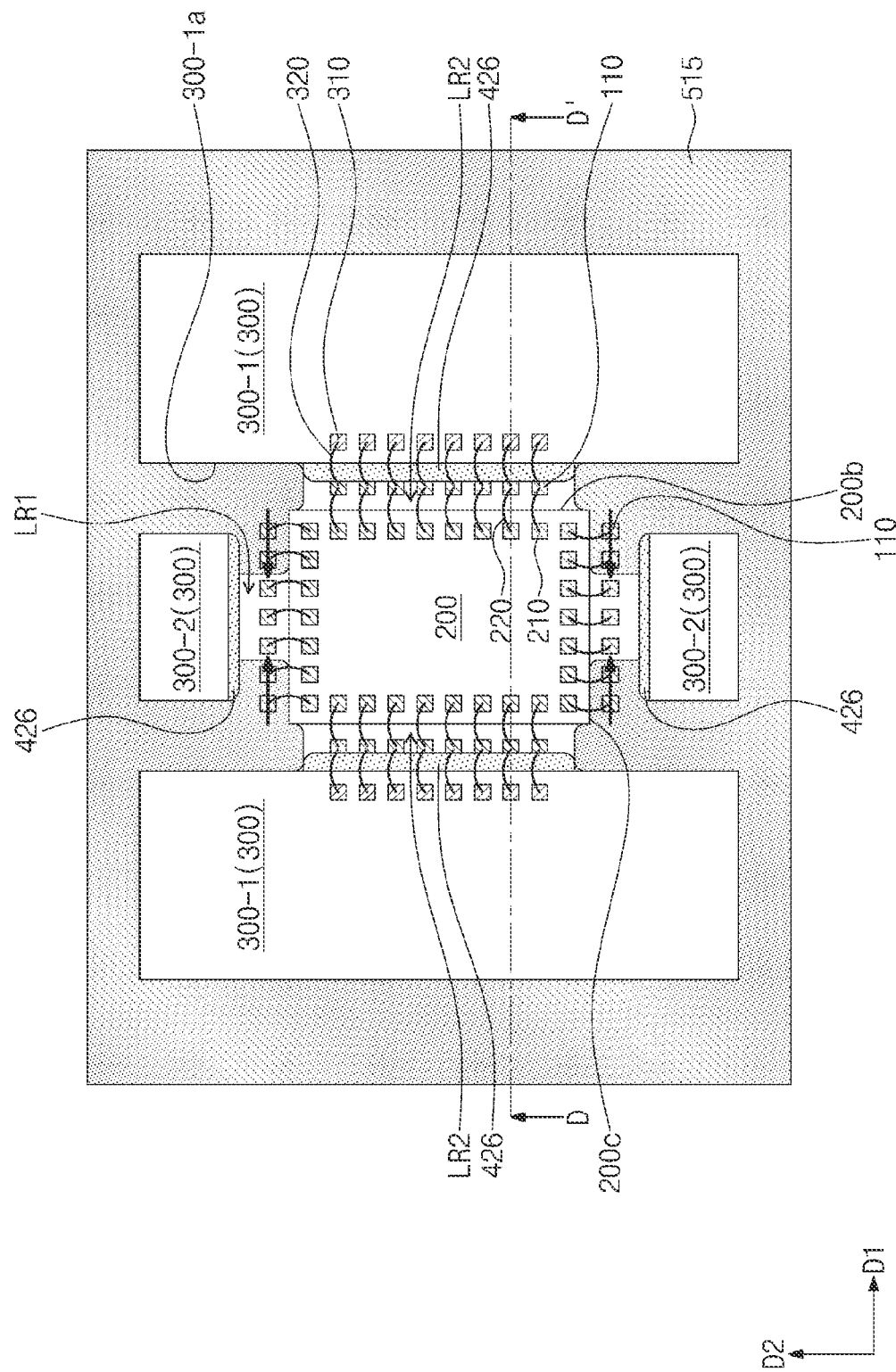
FIG. 23 is a plan view illustrating a method for fabricating a semiconductor package according to some embodiments of the present inventive concepts.

The first semiconductor chip 200 and the first spacer 300-1 may have a narrow open space therebetween. Due to this narrow open space, which may occur when the first spacer 300-1 is provided thereon with neither the first dummy pads 310 nor the first dummy wires 320 adjacent to the first semiconductor chip 200, the molding member 515 may not easily enter the second line region LR2. FIG. 23 illustrates a plan view showing a method for fabricating a semiconductor package, and FIG. 22 corresponds to a cross-section taken along line D-D' of FIG. 23.

Referring to FIGS. 22 and 23, a first semiconductor chip 200 and spacers 300 may be attached to a substrate 100. After that, the first semiconductor chip 200 may be wire-bonded to the substrate 100. Neither first dummy pads nor first dummy wires may be provided on the spacers 300.

A second semiconductor chip 400 may be provided on the first semiconductor chip 200 and the spacers 300. The second semiconductor chip 400 may be provided with an adhesive layer 420 on an inactive surface thereof, and the adhesive layer 420 may be in contact with a top surface of the first semiconductor chip 200 and to top surfaces of the spacers 300.

The second semiconductor chip 400 may undergo a thermo-compression process to attach the second semiconductor chip 400 to the top surface of the first semiconductor chip 200 and the top surfaces of the spacers 300. For example, the thermo-compression process may be performed such that the adhesive layer 420 is melted by heat generated from the thermo-compression process, and that the adhesive layer 420 is completely attached to the top surface of the first semiconductor chip 200 and the top surfaces of the spacers 300. When the thermo-compression process is performed, the melted adhesive layer 420 may be externally discharged from a space between the second semiconductor chip 400 and the first semiconductor chip 200 and between the second semiconductor chip 400 and the spacers 300. Neither the first dummy pads 310 nor the first dummy wires 320 are provided on a top surface of the first spacer 300-1, and thus a third protrusion 426 may be formed of the melted adhesive layer 420 that is introduced into a space between the first semiconductor chip 200 and the first spacer 300-1. The introduced adhesive layer 420 may cover a lateral surface of the first spacer 300-1, and the third protrusion 426 of the adhesive layer 420 may fill a portion of the second line region LR2. In such a case, the third protrusion 426 of the adhesive layer 420 may cause the second line region LR2 to have a narrow space.

Afterwards, a plurality of second semiconductor chips 400 may be stacked on the second semiconductor chip 400' attached to the first semiconductor chip 200 and the spacers 300. The second semiconductor chips 400 may be wire-bonded to the substrate 100.

A molding layer may be formed on the substrate 100. For example, a molding member 515 may be coated on the substrate 100, covering the second semiconductor chips 400 and the top surface of the substrate 100. The molding member 515 may be introduced into a space between the first semiconductor chip 200 and the spacers 300. In this case, as shown in FIG. 23, the third protrusion 426 of the adhesive layer 420 may force the molding member 515 to incompletely fill the second line region LR2. For example, the third protrusion 426 may interrupt flow of the molding member 515, and the molding member 515 may not be introduced into the second line region LR2. Therefore, a void such as air gap may be produced between the first semiconductor chip 200 and the first spacer 300-1, and the first semiconductor chip 200 and the signal wires 220 may be vulnerable to external impact.

According to the present inventive concepts, the molding member 515 may easily enter the first and second line regions LR1 and LR2 that surround the first semiconductor chip 200. The first semiconductor chip 200 may be surrounded by the molding layer 500, and a void may be unlikely to occur in the molding layer 500 around the first semiconductor chip 200. Therefore, the molding layer 500 may protect the first semiconductor chip 200 and the signal wires 220, defects may occur less in semiconductor package fabrication, and a semiconductor package may be manufactured to have increased structural stability.

Referring back to FIGS. 2 and 4, external terminals 105 may be formed on a bottom surface of the substrate 100. The external terminals 105 may include solder balls or solder pads.

Accordingly, a semiconductor package may be fabricated as illustrated in FIGS. 1 to 5.

A semiconductor package according to some embodiments of the present inventive concepts may be configured such that a molding layer surrounds a lower semiconductor chip and may be in (e.g., may completely fill) a space between the lower semiconductor chip and spacers. Thus, the molding layer may protect the lower semiconductor chip, and the semiconductor package may increase in structural stability.

According to the present inventive concepts, the molding member may be easily introduced into line regions that surround the lower semiconductor chip. The molding member may surround the lower semiconductor chip, and a void may be unlikely to occur in the molding member around the lower semiconductor chip. Accordingly, the molding layer may protect the lower semiconductor chip, defects may occur less in semiconductor package fabrication, and the semiconductor package may be manufactured to have increased structure stability.

Although the present inventive concepts have been described in connection with some embodiments of the present inventive concepts illustrated in the accompanying drawings, it will be understood by one of ordinary skill in the art that variations in form and detail may be made therein without departing from the scope of the present inventive concepts. The above disclosed embodiments should thus be considered illustrative and not restrictive.

What is claimed is:

1. A semiconductor package comprising:
   a first semiconductor chip on a substrate;
   a second semiconductor chip between the substrate and the first semiconductor chip; and
   a spacer between the substrate and the first semiconductor chip and spaced apart from the second semiconductor chip,
   wherein the substrate includes a first substrate pad between the second semiconductor chip and the spacer,
   wherein the second semiconductor chip includes a chip pad on a top surface of the second semiconductor chip and a signal wire extending from the chip pad toward the first substrate pad,
   wherein the spacer includes a first dummy pad on a top surface of the spacer and a first dummy wire coupled to the first dummy pad, the first dummy pad being adjacent to the second semiconductor chip,
   wherein the first semiconductor chip is attached to the top surface of the second semiconductor chip and the top surface of the spacer by an adhesive layer on a bottom surface of the first semiconductor chip, and
   wherein a portion of the signal wire and a portion of the first dummy wire are in the adhesive layer.

2. The semiconductor package of claim 1, wherein, between the second semiconductor chip and the spacer, the adhesive layer is spaced apart from a first lateral surface of the second semiconductor chip and a second lateral surface of the spacer, the first lateral surface facing the spacer, and the second lateral surface facing the second semiconductor chip.

3. The semiconductor package of claim 2, wherein, between the second semiconductor chip and the spacer, a lowermost end of the adhesive layer is located at a level higher than a level of an intermediate point between a top surface of the substrate and the top surface of the second semiconductor chip.

4. The semiconductor package of claim 1,
   wherein the first dummy wire is stitch-bonded to the first dummy pad, and
   wherein the first dummy wire includes:
      a first bonding part attached to the first dummy pad; and
      a first wire loop extending from the first bonding part.

5. The semiconductor package of claim 4,
   wherein a first end of the first wire loop is connected to the first bonding part, and
   wherein a second end of the first wire loop is coupled to the first substrate pad, the second end being opposite to the first end.

6. The semiconductor package of claim 4,
   wherein a first end of the first wire loop is connected to the first bonding part, and
   wherein a second end of the first wire loop is in the adhesive layer, the second end being opposite to the first end.

7. The semiconductor package of claim 4,
   wherein the first dummy pad is one dummy pad of a pair of first dummy pads that are adjacent each other on the top surface of the spacer,
   wherein the first bonding part comprises one bonding part of a pair of first bonding parts of the first dummy wire that are attached to the pair of first dummy pads, respectively, and
   wherein the first wire loop connects the pair of first bonding parts to each other.

8. The semiconductor package of claim 4, wherein the first bonding part has a ball shape.

9. The semiconductor package of claim 4, wherein the first bonding part is in the adhesive layer.

10. The semiconductor package of claim 1, further comprising a molding layer on the first semiconductor chip, the second semiconductor chip, and the spacer,
    wherein, below the first semiconductor chip, the molding layer is in a space between the second semiconductor chip and the spacer.

11. The semiconductor package of claim 10,
    wherein, in the space between the second semiconductor chip and the spacer, the molding layer is in contact with a bottom surface of the adhesive layer,
    wherein the molding layer is in contact with a first lateral surface of the second semiconductor chip and with a second lateral surface of the spacer, and
    wherein the first lateral surface and the second lateral surface face each other.

12. The semiconductor package of claim 1,
    wherein the substrate further includes a second substrate pad between the first substrate pad and the spacer, and
    wherein the first dummy wire connects the first dummy pad to the second substrate pad.

13. The semiconductor package of claim 1, wherein, on the top surface of the second semiconductor chip, the chip pad is adjacent to the spacer,
    wherein the second semiconductor chip includes:
       a second dummy pad on the top surface of the second semiconductor chip, the second dummy pad being adjacent to the spacer and spaced apart from the chip pad; and a second dummy wire on the second semiconductor chip and coupled to the second dummy pad,
wherein the second dummy pad is electrically insulated from the second semiconductor chip.

14. The semiconductor package of claim 1, wherein an interval between the second semiconductor chip and the spacer is in a range of about 500 micrometers (μm) to about 1,000 μm.

15. A semiconductor package comprising:
a substrate including a plurality of first substrate pads aligned with each other in a first direction;
a first semiconductor chip on the substrate;
a spacer on the substrate and spaced apart in a second direction from the first semiconductor chip across the plurality of first substrate pads, the second direction intersecting the first direction;
a second semiconductor chip attached by an adhesive layer to a top surface of the first semiconductor chip and a top surface of the spacer;
a plurality of signal wires extending toward the plurality of first substrate pads, respectively, from the top surface of the first semiconductor chip;
a plurality of first bonding parts on respective dummy pads on the top surface of the spacer; and
a molding layer on the first semiconductor chip, the spacer, and the second semiconductor chip, the molding layer being in a space between the first semiconductor chip and the spacer,
wherein the dummy pads are aligned with each other in the first direction adjacent a first lateral surface of the spacer, the first lateral surface being adjacent to the first semiconductor chip.

16. The semiconductor package of claim 15, wherein the plurality of first bonding parts are in the adhesive layer.

17. The semiconductor package of claim 15, further comprising a plurality of first wire loops extending from respective ones of the plurality of first bonding parts,
wherein the plurality of first wire loops connect the dummy pads, respectively, to the plurality of first substrate pads.

18. The semiconductor package of claim 15,
wherein an interval between the plurality of signal wires is in a range of about 50 micrometers (μm) to about 100 μm, and
wherein an interval between the plurality of first bonding parts is in a range of about 50 μm to about 100 μm.

19. A semiconductor package comprising:
a first semiconductor chip and a spacer that are spaced apart from each other on a substrate; and
a second semiconductor chip attached by an adhesive layer to the first semiconductor chip and the spacer,
wherein the first semiconductor chip includes a plurality of signal wires extending from a top surface of the first semiconductor chip and passing through a space between the first semiconductor chip and the spacer to connect to the substrate,
wherein the spacer includes a plurality of dummy wires connected to a top surface of the spacer,
wherein the plurality of signal wires are aligned with each other adjacent a first lateral surface of the first semiconductor chip, the first lateral surface of the first semiconductor chip facing the spacer,
wherein the plurality of dummy wires are aligned with each other adjacent a second lateral surface of the spacer, the second lateral surface of the spacer facing the first semiconductor chip, and
wherein the adhesive layer is in contact with the top surface of the first semiconductor chip and the top surface of the spacer, and
wherein, between the first semiconductor chip and the spacer, the adhesive layer is spaced apart from the first lateral surface of the first semiconductor chip and the second lateral surface of the spacer.

20. The semiconductor package of claim 19, wherein the plurality of dummy wires pass through the space between the first semiconductor chip and the spacer to connect to the substrate.

* * * * *